(12) United States Patent
Smith et al.

(10) Patent No.: US 6,188,281 B1
(45) Date of Patent: Feb. 13, 2001

(54) LINEAR TRANSCONDUCTANCE CIRCUITS HAVING CLASS AB AMPLIFIERS PARALLEL COUPLED WITH CONCAVE COMPENSATION CIRCUITS

(75) Inventors: Douglas L. Smith, Tucson; Scott C. McLeod, Oro Valley, both of AZ (US)

(73) Assignees: Maxim Integrated Products, Inc., Sunnyvale, CA (US); Gain Technology Corporation, Tucson, AZ (US)

( * ) Notice: Under 35 U.S.C. 154(b), the term of this patent shall be extended for 0 days.

(21) Appl. No.: 09/163,891

(22) Filed: Sep. 30, 1998

(51) Int. Cl.$^7$ ........................................... H03F 3/45
(52) U.S. Cl. ................................. 330/252; 330/295
(58) Field of Search .................................. 330/252, 253, 330/254, 255, 295; 327/359

(56) References Cited

U.S. PATENT DOCUMENTS

| | | | |
|---|---|---|---|
| 4,965,528 | 10/1990 | Okanobu | 330/252 |
| 5,006,818 | 4/1991 | Koyama et al. | 330/261 |
| 5,079,515 | 1/1992 | Tanimoto | 330/256 |
| 5,399,988 | * 3/1995 | Knierim | 330/252 X |
| 5,903,185 | * 5/1999 | Cargill | 330/252 X |
| 5,907,262 | * 5/1999 | Graeme et al. | 330/255 |
| 5,917,378 | * 6/1999 | Juang | 330/253 |

OTHER PUBLICATIONS

Katsuji Kimura, "The Ultra–Multi–Tanh Technique for Bipolar Linear Transconductance Amplifiers", Apr. 1997, IEEE Transactions on Circuits and Systems–I Fundamental Theory and Applications, vol. 44, No. 4, pp 288–302.

Barrie Gilbert, "The Multi–tanh Principle: A Tutorial Overview," Jan. 1998, IEEE Journal of Solid–State Circuits, vol. 33, No. 1, pp. 2–17.

Barrie Gilbert, "Translinear Circuits" May 1981, ECESSO course notes, University of Arizona, Original Publication Unknown.

* cited by examiner

Primary Examiner—Steven J. Mottola
(74) Attorney, Agent, or Firm—Hickman Coleman & Hughes, LLP

(57) ABSTRACT

The present invention teaches a variety of transconductance circuits formed having a class AB transconductor amplifier coupled in parallel with at least one concave compensation circuit. When the transconductance circuit has only one concave compensation circuit, the concave compensation circuit is designed with no offset so that the concave transconductance gain of the compensation circuit compensates for the convex transconductance gain of the class AB amplifier thereby providing a more linear transconductance circuit. When the transconductance circuit includes multiple concave compensation circuits, they each are designed with an offset chosen such that the combination of the individual concave transfer functions achieve a more linear transconductance circuit.

61 Claims, 23 Drawing Sheets

LINEAR TRANSCONDUCTANCE CIRCUITS HAVING CLASS AB AMPLIFIERS PARALLEL COUPLED WITH CONCAVE COMPENSATION CIRCUITS

DESCRIPTION

1. Technical Field

The present invention is related to operational amplifier design. More specifically, the present invention teaches a variety of linearized class AB differential transconductance circuits each well suited for use as a low-distortion input stage in an operational amplifier.

2. Background Art

In the design of operational amplifiers, it is important to provide a highly linear (i.e., low distortion), low noise amplifier capable of wide bandwidth operation. Bandwidth limitations, noise and distortion can arise at any stage within the operational amplifier, but for present purposes the focus is upon the input stage. The typical input stage is a transconductor or transconductance circuit operable to convert an input voltage signal into an internal current signal more suitable for amplification by a subsequent stage such as the output stage. The transconductance circuit's defining characteristic is its voltage to current transfer function.

Prior Art FIG. 1 illustrates the prototypical input stage transconductor 10, i.e., a differential transistor pair. The transconductor 10 includes a pair of transistors Q1 and Q2 whose emitters are coupled to a bias current source $I_{DC}$ that provides "tail" current for the transconductor 10. The differential voltage input pair $V_{IN+}$ and $V_{IN-}$ drive the bases of the transistors Q1 and Q2, essentially steering the resulting differential current pair $I_{OUT+}$ and $I_{OUT-}$ to a common ground reference 20. As will be appreciated, the theoretical voltage to current transfer function of the differential pair transconductor 10 is a hyperbolic tangent (tanh) function.

While widely applicable and well suited for certain applications, the differential pair transconductor 10 suffers many shortcomings. When used within a capacitive feedback loop, as is often the case, the transconductor 10 grossly limits the slew rate. ("Slew rate" defines the maximum rate of change in voltage across the input and output terminals of the amplifier.) Specifically, the total current available to charge the feedback loop compensation capacitor $C_C$ is limited by the so-call "tail current" of the differential pair, i.e., the bias current $I_{DC}$.

For the present analysis, it is reasonable to assume that the slew rate is equal to $I_{DC}/C_C$. Hence to improve the slew rate, one must decrease $C_C$ and/or increase $I_{DC}$, both of which are undesirable for a variety of well-known reasons. Additionally, the tanh transfer function of the differential pair transconductor 10 means that transconductor 10 is a non-linear, distortive circuit.

One common approach for addressing the slew rate limitations of the differential pair transconductor 10 of FIG. 1 is to use a class AB transconductance amplifier. Prior Art FIG. 2 illustrates one typical class AB amplifier 100 formed from a pair of differentially coupled diamond followers whose output emitters are coupled through a common load resistance $R_{DGEN}$. Each diamond follower includes a pair of bias current sources $I_{DC}$, and four transistors (one follower is made of transistors Q1–Q4, the other follower is made of transistors Q5–Q8).

The voltage to current transfer function of the class AB amplifier 100 without a common load resistance $R_{DGEN}$ (i.e., $R_{DGEN}=0$) is ideally a hyperbolic sine (sinh) function. Prior Art FIG. 4 illustrates such an ideal transconductance of the class AB amplifier 100 (i.e., dIout/dVout) as a function of input voltage. As seen in FIG. 4, the ideal transconductance of the class AB amplifier 100 is non-linear at voltages close to zero, but fairly linear elsewhere. The transfer function of the class AB amplifier will vary for different values of $R_{DGEN}$, but the non-linear characteristics are similar and related to the sinh function represented in FIG. 4.

In practice, the transconductance gain of the class AB amplifier 100 is set by the available bias current, the common load resistor $R_{DGEN}$, and the nonlinear transconductance characteristics of the individual transistors. However, when $R_{DGEN}$ is large it dominates the nonlinear effects of the individual transistors, thereby improving the distortion characteristics of the class AB amplifier 100. Unfortunately, increasing $R_{DGEN}$ increases noise in the class AB amplifier 100 due to thermal noise of the resistor.

As mentioned above with reference to FIG. 1, much of the non-linearity of transconductor 10 is due to the tanh nature of its transfer function. One well-known technique for linearizing differential pair transconductors is the so-called "multi-tanh technique." As will be appreciated, the key to the multi-tanh technique is the placement of multiple non-linear tanh transconductors (i.e., differential pairs) along the input-voltage axis to achieve in combination a more linear transfer function.

Prior Art FIG. 3 illustrates a multi-tanh doublet 200 formed from two differential pairs Q1–Q2 and Q3–Q4 and two bias current sources $I_{DC}$. Positive and negative offsets are introduced by forming each differential transistor pair with a gain imbalance. Specifically, a positive offset is introduced into the differential pair Q1–Q2 by forming transistor Q1 with a gain A that is greater than unity, and transistor Q2 with a gain of substantially unity. Likewise, a negative offset is introduced into the differential pair Q3–Q4 by forming transistor Q4 with a gain A that is greater than unity and transistor Q3 with a gain of substantially unity. Prior Art FIG. 5 illustrates the combined transconductance gain.

The multi-tanh transconductors do improve the distortion characteristics of an input stage, however the multi-tanh technique does not address the slew rate and other problems of the differential pair transconductor. Likewise, the class AB amplifier provides an improved slew rate, yet suffers from the nonlinearity about zero due to its sinh transfer function. What are needed are a variety of transconductance circuits that are highly linear with low noise, and having bandwidth characteristics not limited by slew rate.

DISCLOSURE OF THE INVENTION

The present invention teaches a variety of transconductance circuits formed having a class AB transconductor amplifier coupled in parallel with at least one concave compensation circuit. When the transconductance circuit has only one concave compensation circuit, the concave compensation circuit is preferably designed without offset so that the concave transconductance gain of the compensation circuit compensates for the convex transconductance gain of the class AB amplifier thereby providing a more linear transconductance circuit. When the transconductance circuit includes multiple concave compensation circuits, each transconductance circuit is preferably designed with an offset chosen such that the combination of the individual concave transfer functions achieve a more linear transconductance circuit.

For example, one transconductance circuit of the present invention has a class AB transconductance amplifier parallel coupled with two concave compensation circuits. The first concave compensation circuit has a positive offset while the second compensation circuit has a negative offset. In preferred embodiments, the offsets' magnitudes are substantially equivalent and the compensation circuits are of the same type. In one particular embodiment, the compensation circuits are formed as tanh doublets. The offsets for these tanh doublets can be brought about by a variety of mechanisms such as an imbalance in the sizes or current saturation of the transistors, an imbalance in the bias current sources, or the placement of resistors in series with the signal path.

The present invention also teaches an operational amplifier having multiple stages including an input stage. The input stage includes a class AB transconductance amplifier and a concave compensation circuit coupled in parallel across differential input and output pairs. As described above, the concave transconductance gain of the concave compensation circuit improves linearity of the voltage to current transfer function of the input stage by compensating for the convex transconductance gain of the class AB amplifier. The input stage may be formed with additional concave compensation circuits having offsets selected to further improve the linearity of the input stage.

Yet another embodiment of the present invention teaches a multiple stage circuit including a transconductance stage driving subsequent current driven stages. The transconductance stage includes a class AB amplifier parallel coupled with at least one concave transconductance amplifier. The inputs of these two amplifiers are directly coupled. The outputs of the two amplifiers are not coupled, instead each drive separate subsequent stages. The subsequent stages are later directly or indirectly coupled to the final output, with the result being an improved linearity of the multiple stage circuit.

BRIEF DESCRIPTION OF THE DRAWINGS

Prior Art

Prior Art

Prior Art

Prior Art

Prior Art

BEST MODES FOR CARRYING OUT THE INVENTION

The present invention teaches a variety of transconductance circuits formed having a class AB transconductor amplifier coupled in parallel with at least one concave compensation transconductor circuit. The class AB transconductor amplifiers have non-linear, convex voltage to current transfer functions. By coupling at least one concave compensation transconductor circuit with a class AB transconductor, a more linear transfer function for the combined transconductance circuit is achieved. Certain embodiments have multiple parallel-coupled compensation circuits. Preferably, each parallel-coupled compensation circuit is designed with an offset chosen such that the individual transfer functions are arranged along the input voltage axis to achieve a more linear transfer function of the combined transconductance circuit.

Figure 1:
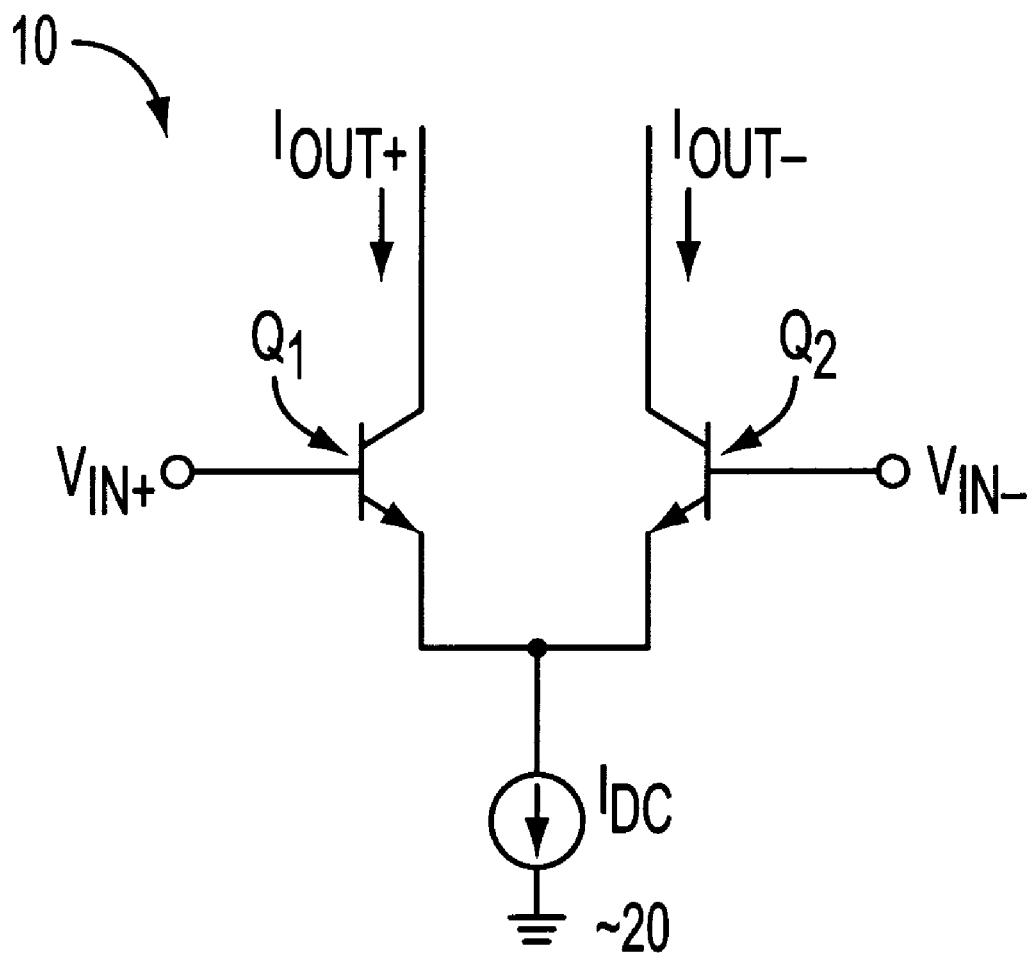
FIG. 1 is a schematic of a traditional differential transconductor that is simply a differentially connected pair of transistors.
Figure 2:
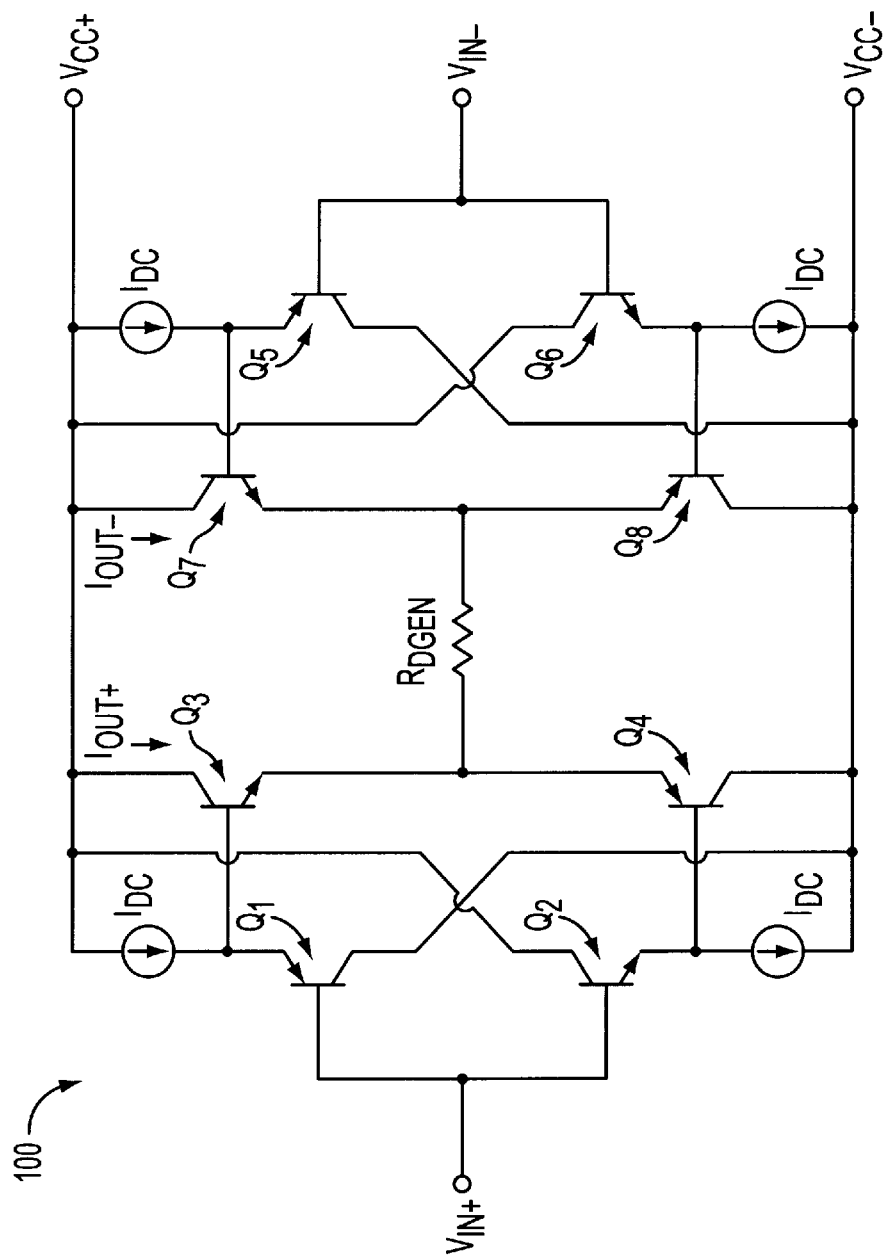
FIG. 2 is a schematic of a class AB input stage transconductor.
Figure 3:
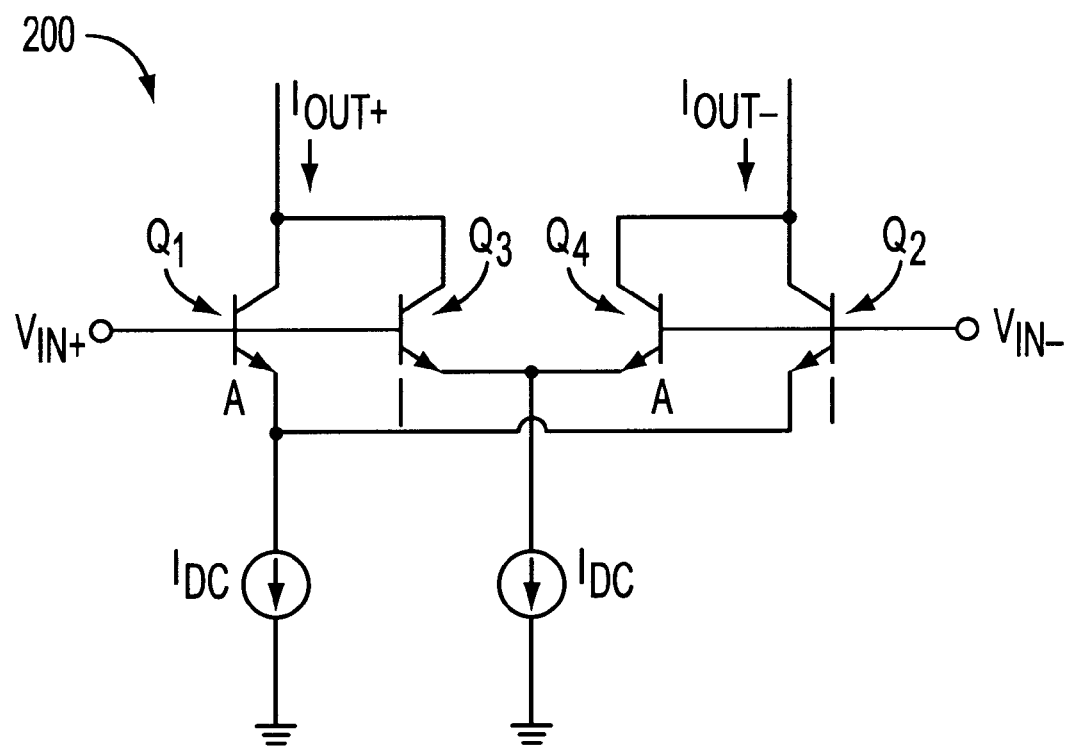
FIG. 3 is a schematic of a multi-tanh doublet input stage transconductor.
Figure 4:
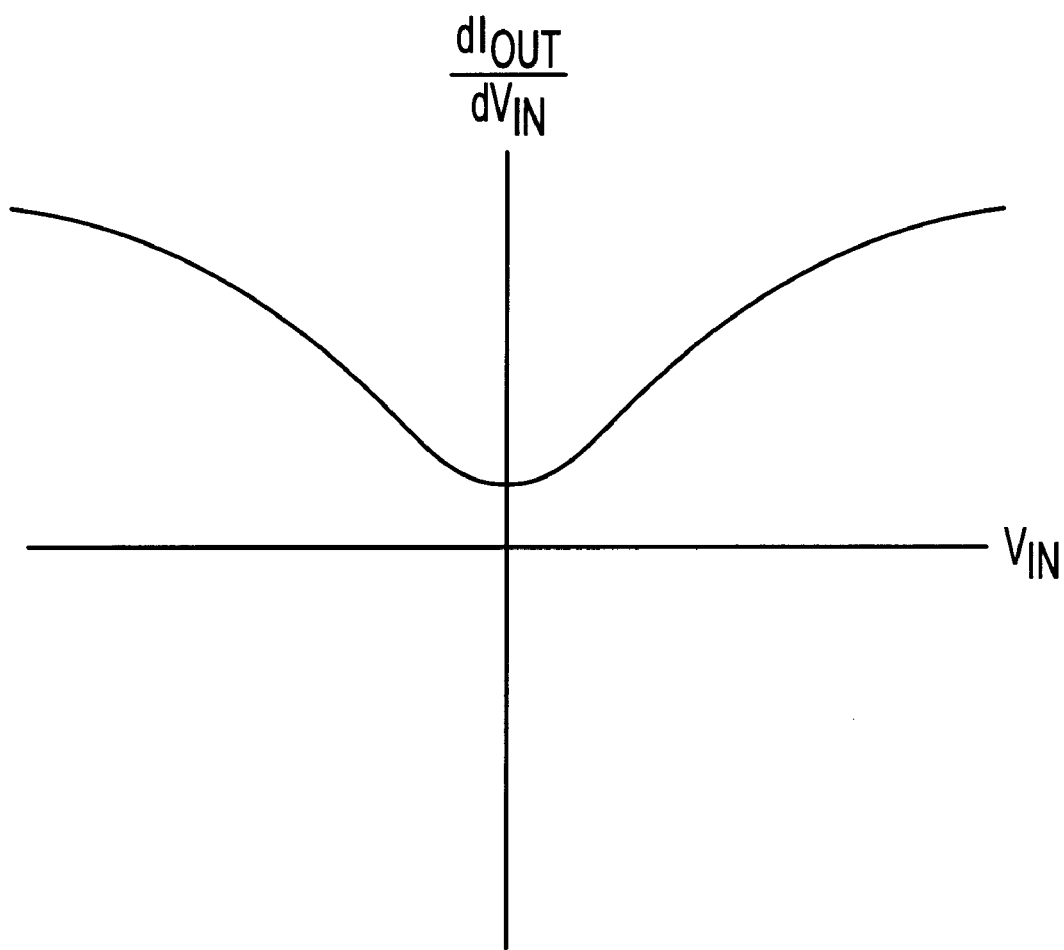
FIG. 4 is a graph representing transconductance gain of the class A-B input stage transconductor as a function of input voltage.
Figure 5:
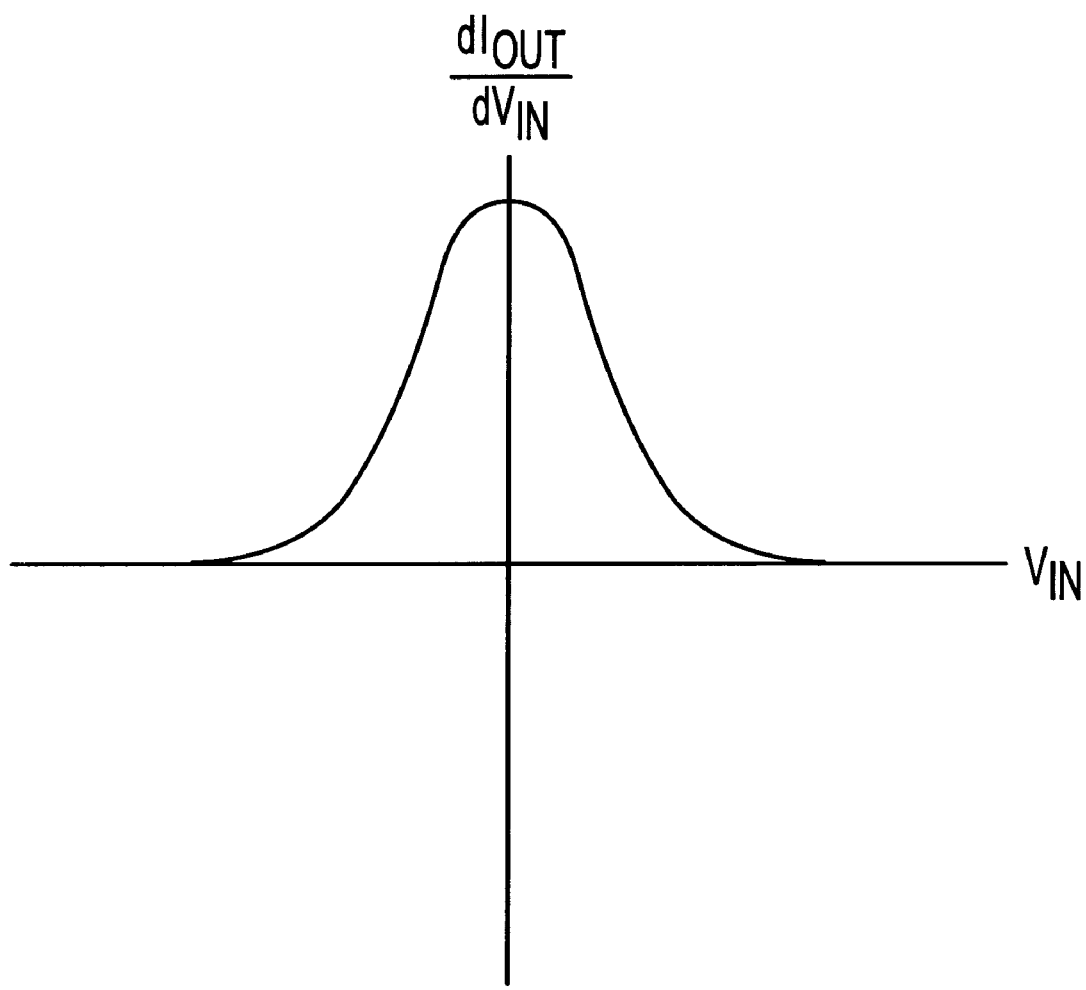
FIG. 5 is a second graph representing transconductance gain of the multi-tanh doublet input stage transconductor as a function of input voltage.
Figure 6:
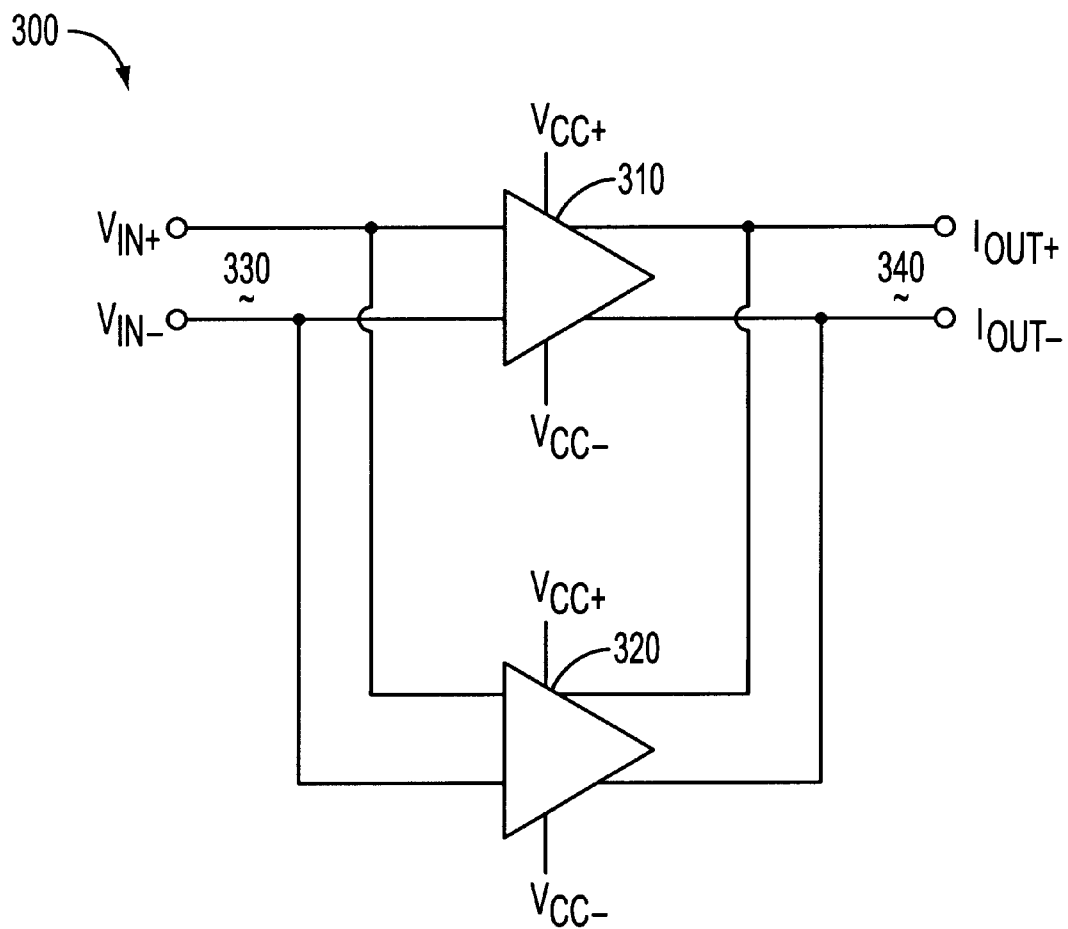
FIG. 6 is a schematic of a transconductance circuit in accordance with one embodiment of the present invention.

FIG. 6 illustrates a transconductance circuit 300 in accordance with a first embodiment of the present invention. The transconductance circuit 300 includes a class AB amplifier 310 and a concave compensation circuit 320 coupled in parallel across differential input differential 330 and differential output differential 340. The range of suitable concave compensation circuits 320 is quite varied. For example, the compensation circuit 320 may be a differentially coupled transistor pair or a tanh doublet.

The class AB amplifier type may be selected from any of the wide variety of class AB amplifier designs. Some specific class AB amplifiers are described below in more detail with reference to FIGS. 8A and 13A–13H. Those skilled in the art of electronics will be familiar with the design and implementation of class AB amplifiers.

Figure 7A:
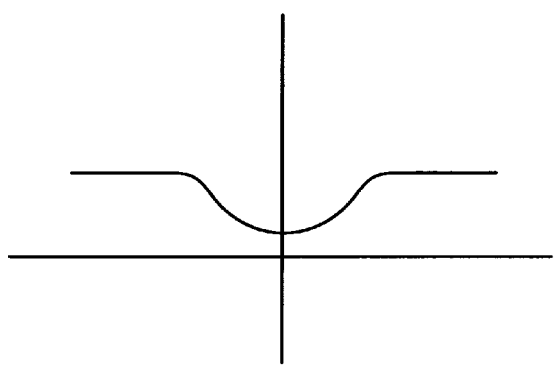
FIG. 7A is a graph representing the convex transconductance gain of a class AB transconductor amplifier.
Figure 7B:
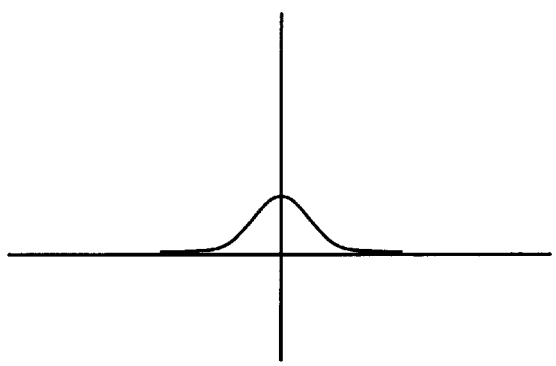
FIG. 7B is a graph representing transconductance gain of a concave compensation circuit.
Figure 7C:
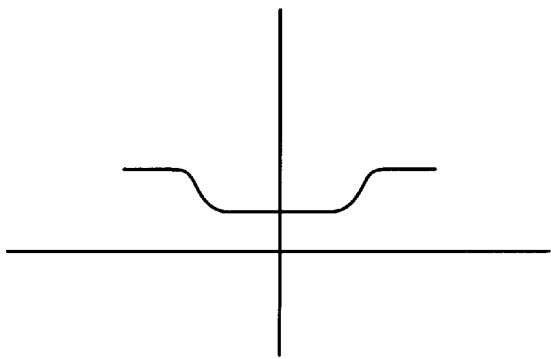
FIG. 7C is a graph representing transconductance gain of the class AB transconductance circuit including a concave compensation circuit as shown in FIG. 6.

FIGS. 7A–7C illustrate pictorially how the concave compensation circuit 320 improves linearity of the transconductance circuit 300. FIG. 7A provides a representation of the convex transconductance gain of the class AB amplifier 310. FIG. 7B provides a representation of the concave transconductance gain of the compensation circuit 320. By coupling the class AB amplifier 310 in parallel with the concave compensation circuit 320, the resultant gain of the transconductance circuit 300 is essentially the arithmetic sum of the two circuits' separate gains. FIG. 7C thus provides a representation of the more linear transconductance gain of the transconductance circuit 300. It will be appreciated that the gain representations of FIGS. 7A–7C are simply representations of possible non-linear gain functions. In application, the realized gain will be a function of each particular circuit utilized.

Figure 8A:
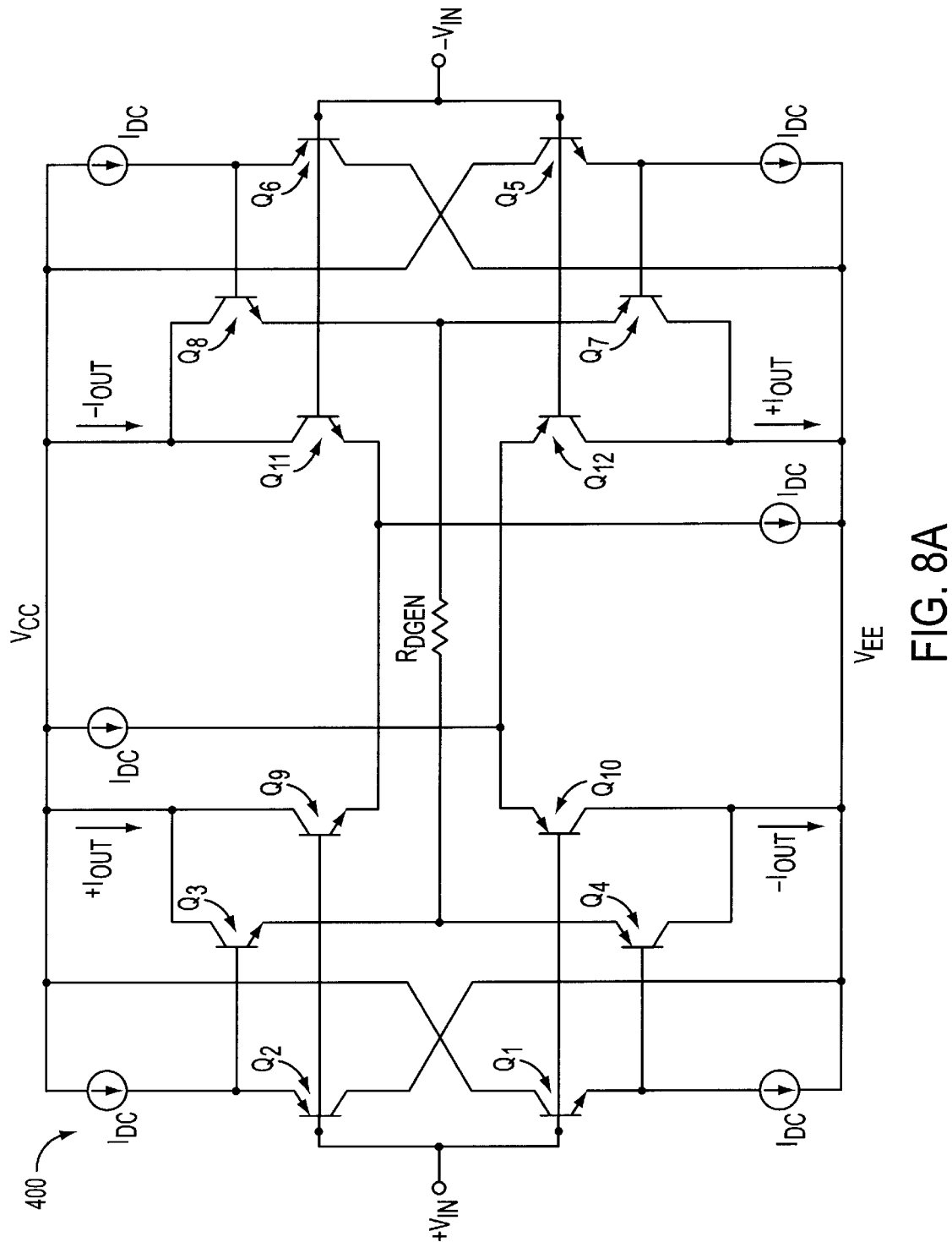
FIG. 8A is a schematic illustrating with particularity one embodiment of the transconductance circuit of FIG. 6.
Figure 8B:
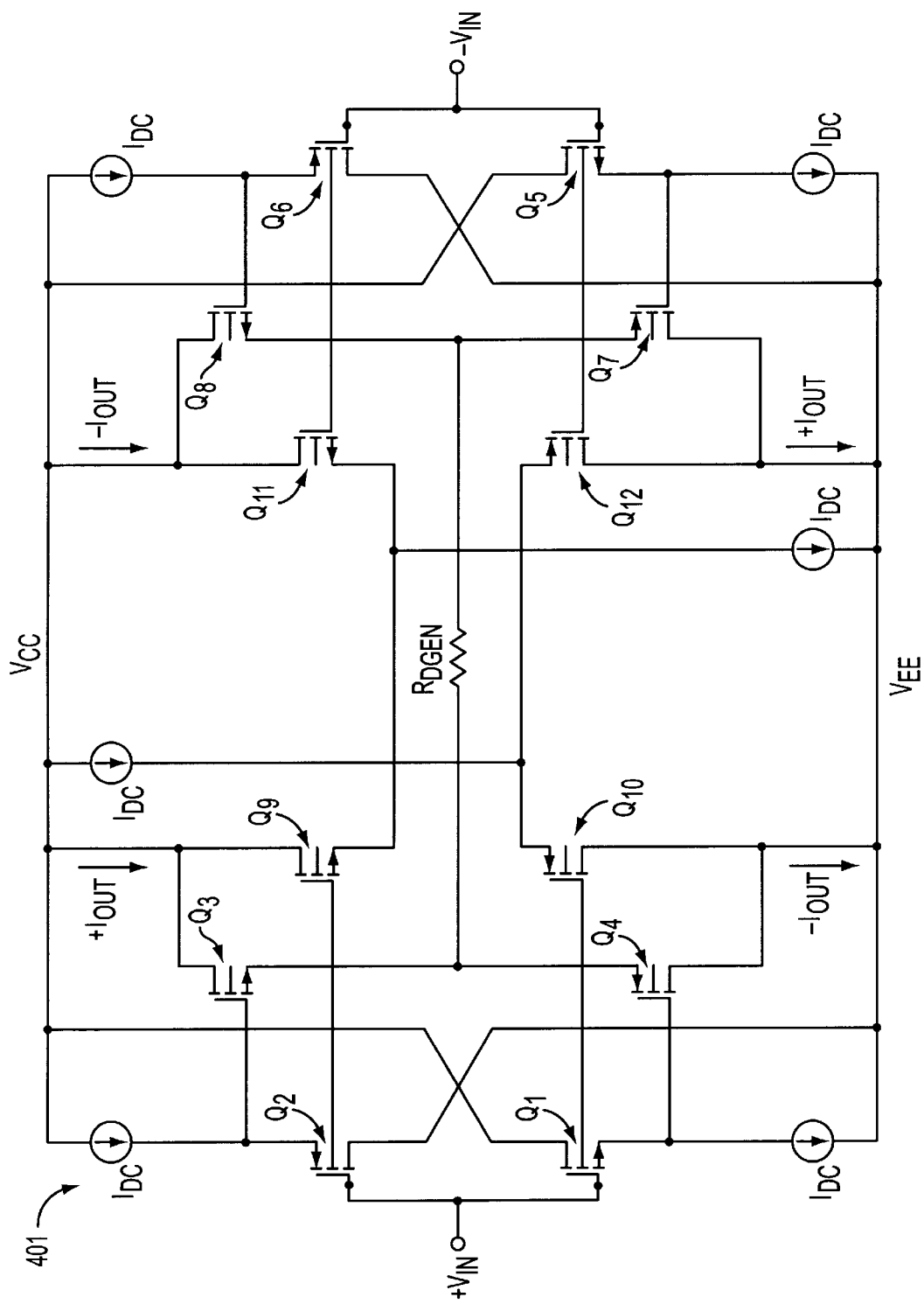
FIG. 8B is a schematic illustrating with particularity another embodiment of the transconductance circuit of FIG. 6.

FIG. 8A, like FIG. 6, illustrates a transconductance circuit 400 of the present invention having a class AB transconductor amplifier coupled in parallel with a concave compensation circuit. FIG. 8A, however, is implemented with definite types for the class AB amplifier and the compensation circuit. Specifically, the class AB amplifier of FIG. 8A is formed from a pair of differentially coupled diamond followers whose output emitters may be coupled through a common load resistance $R_{DGEN}$. Alternatively, the common load resistance $R_{DGEN}$ can be left out of the circuit. Each diamond follower includes a pair of bias current sources $I_{DC}$, and four transistors (one follower is made of transistors Q1–Q4, the other follower is made of transistors Q5–Q8). As will be appreciated, the gain of the class AB amplifier of FIG. 8A implemented with bipolar transistors and lacking the common load resistance is theoretically a hyperbolic sine (sinh) function.

The concave compensation circuit of FIG. 8A is simply two differential transistor pairs. The first differential transistor pair is formed from a pair of transistors Q9 and Q11 whose emitters are coupled to a bias current source $I_{DC}$ that provides the necessary tail current. Similarly, the second differential transistor pair is formed from a pair of transistors Q10 and Q12 whose emitters are coupled to a bias current source $I_{DC}$ that provides the necessary tail current. The transconductance gain of these two pairs is related to the tanh function, and thus these two pairs work well as a concave compensation circuit for linearizing the class AB amplifier of FIG. 8A.

Figure 9A:
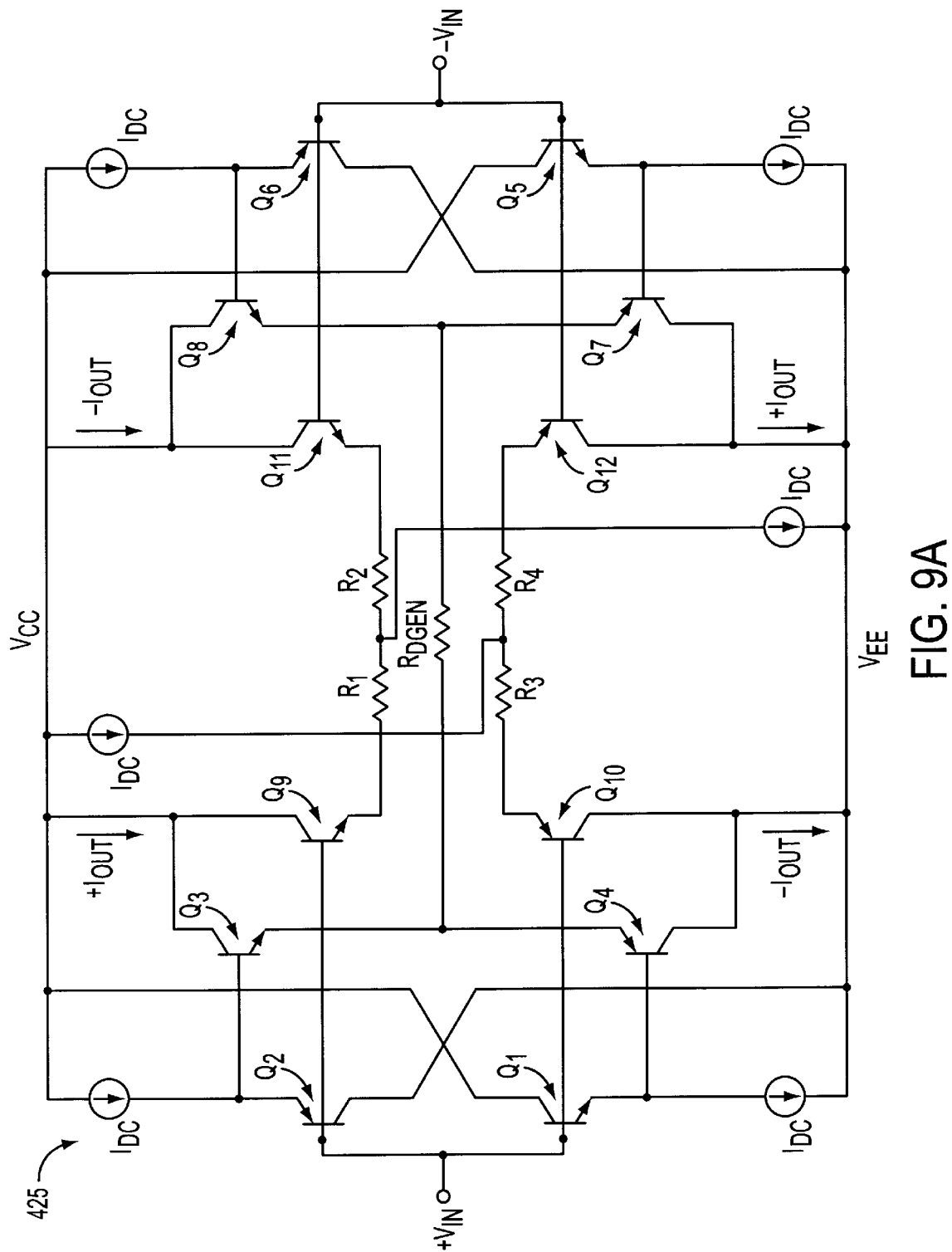
FIG. 9A is a schematic illustrating with particularity another embodiment of the transconductance circuit of FIG. 6.
Figure 9B:
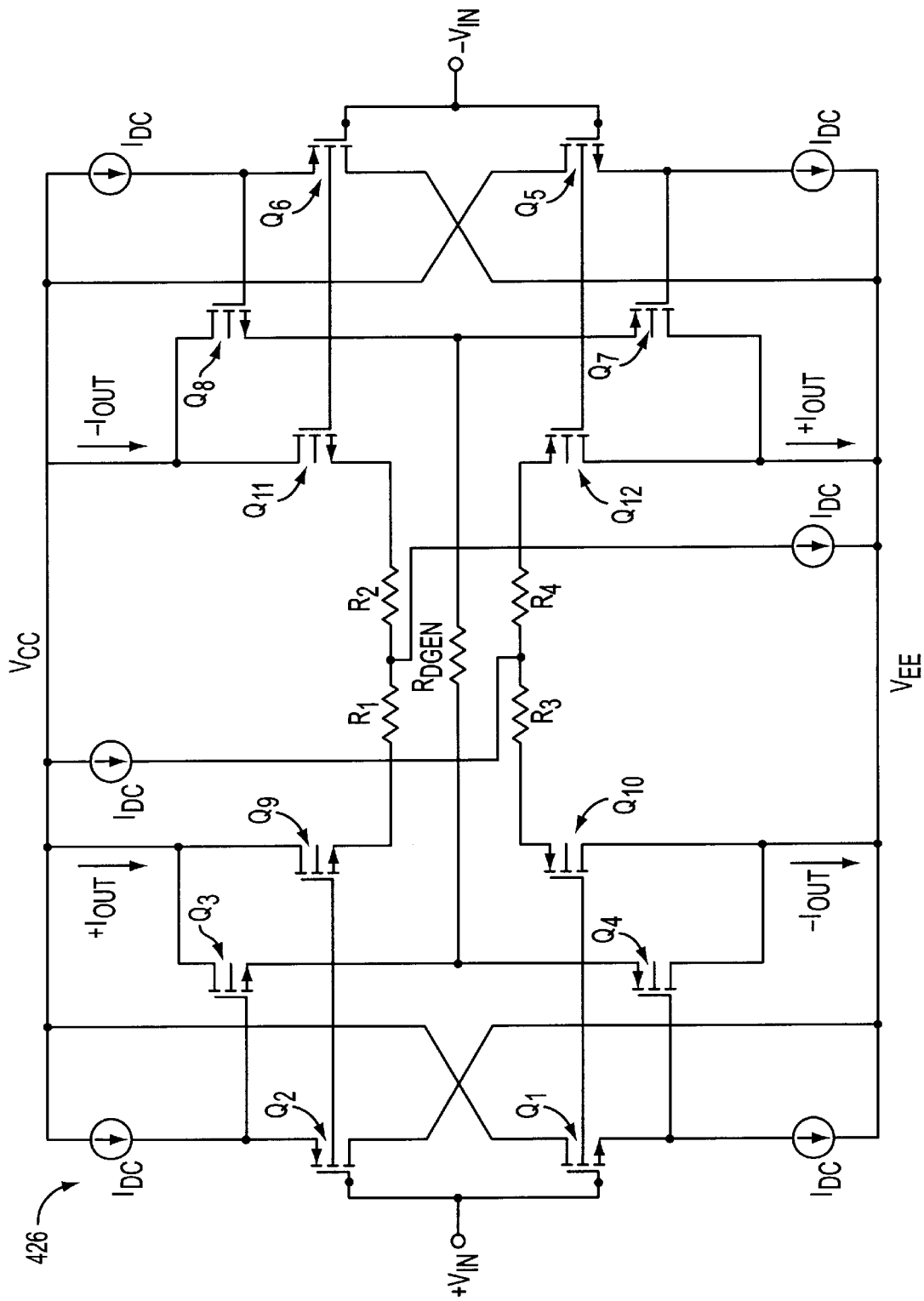
FIG. 9B is a schematic illustrating with particularity another embodiment of the transconductance circuit of FIG. 6.

FIG. 9A illustrates a transconductance circuit 425 that provides an additional degree of freedom for improving linearity of the transconductance circuit by including emitter resistors in the concave compensation circuit. The difference between the transconductance circuit 425 of FIG. 9A and the transconductance circuit 400 of FIG. 8A is the presence of emitter resistors $R_1$–$R_4$ in transconductance circuit 425. In preferred embodiments, $R_1=R_4$ and $R_2=R_3$. These resistors provide so-called "emitter degeneration" which can be used to shape the final transconductance to obtain the best linearity possible.

Another mechanism for improving the linearization effect of the concave compensation circuit involves parallel coupling multiple concave compensation circuits with the class AB amplifier. In particular, the multiple concave compensation circuits can be offset along the input voltage axis such that the overall effect is to better linearize the transconductance circuit.

Figure 10:
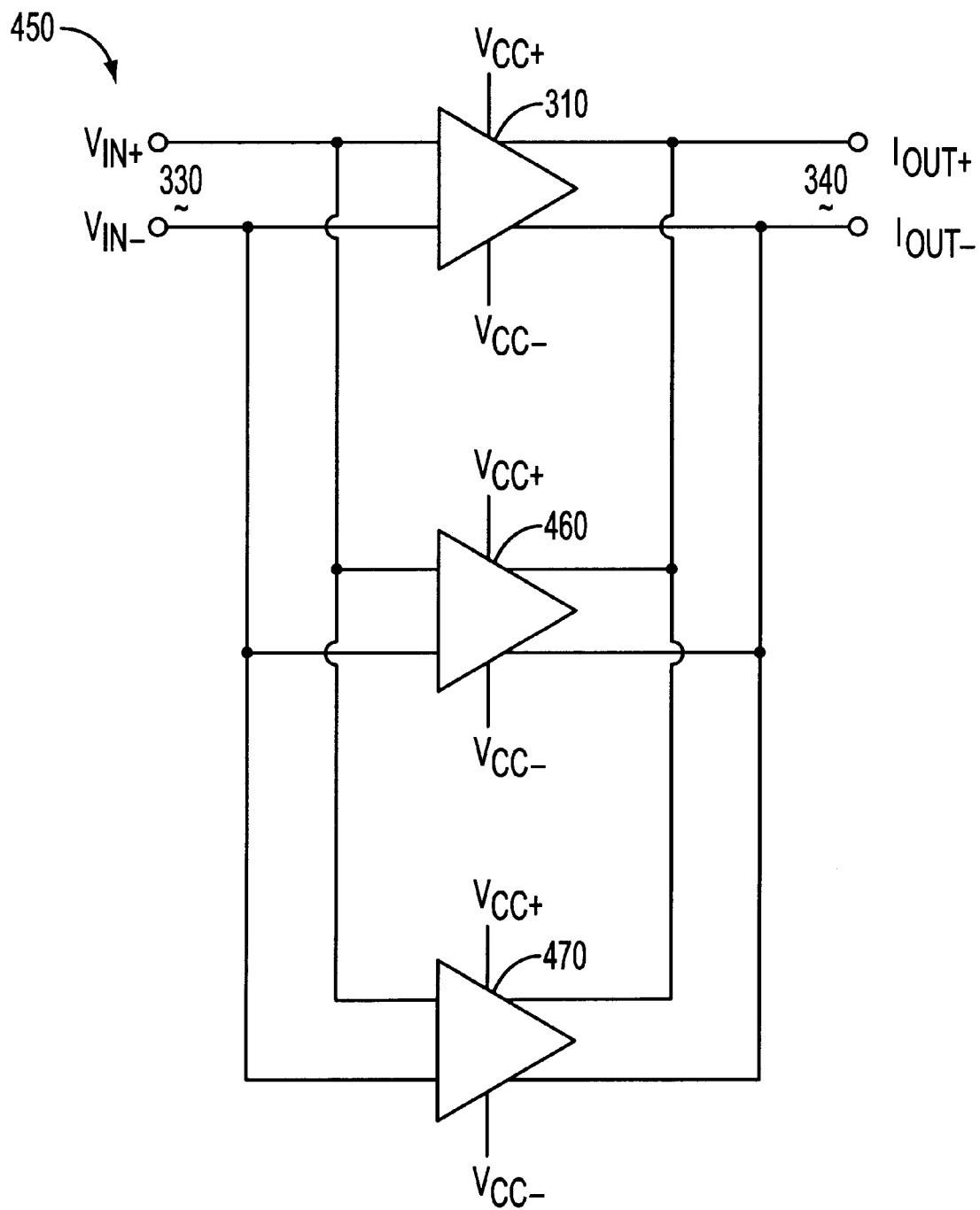
FIG. 10 is a schematic of a transconductance circuit having two offset concave compensation circuits in accordance with yet another embodiment of the present invention.
Figure 11A:
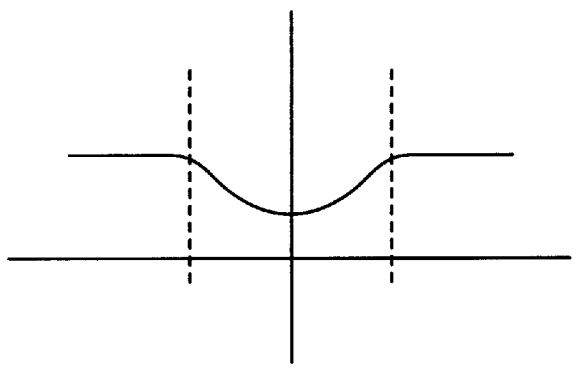
FIG. 11A is a graph representing the convex transconductance gain of a class AB transconductor amplifier.
Figure 11B:
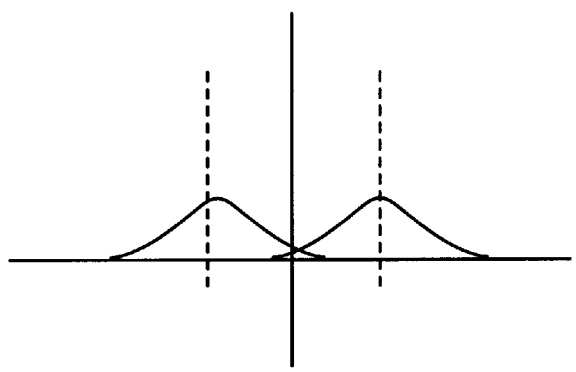
FIG. 11B is a graph representing the transconductance gains of the two offset concave compensation circuits of FIG. 10.
Figure 11C:
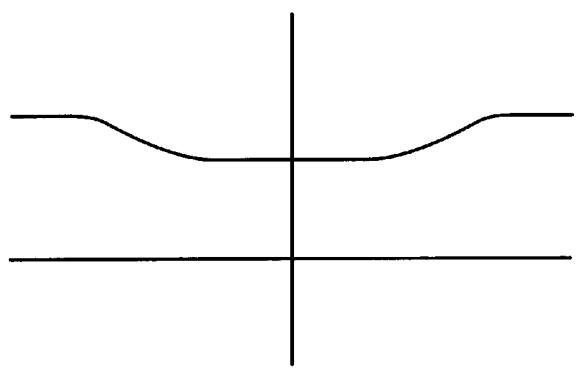
FIG. 11C is a graph representing transconductance gain of the class AB transconductance circuit including two offset concave compensation circuits as shown in FIG. 10.

FIG. 10 illustrates a generic transconductance circuit 450 having a class AB amplifier 310 and a pair of parallel coupled concave compensation circuits 460 and 470. The concave compensation circuits 460 and 470 are formed with positive and negative offsets, respectively. In preferred embodiments, the compensation circuits 460 and 470 are of similar electrical behavior and have offsets of equivalent magnitude. As shown in FIG. 11A, the class AB amplifier 310 has some sort of convex transconductance gain. FIG. 11B illustrates the pair of offset transconductance gains of concave compensation circuits 460 and 470. FIG. 11C shows the linearized transconductance gain of the transconductance circuit 450. As will be appreciated, the plots of FIGS. 11A–11C are simply illustrative representations, the realized gains of these circuits depending upon the particular designs implemented.

Figure 12A:
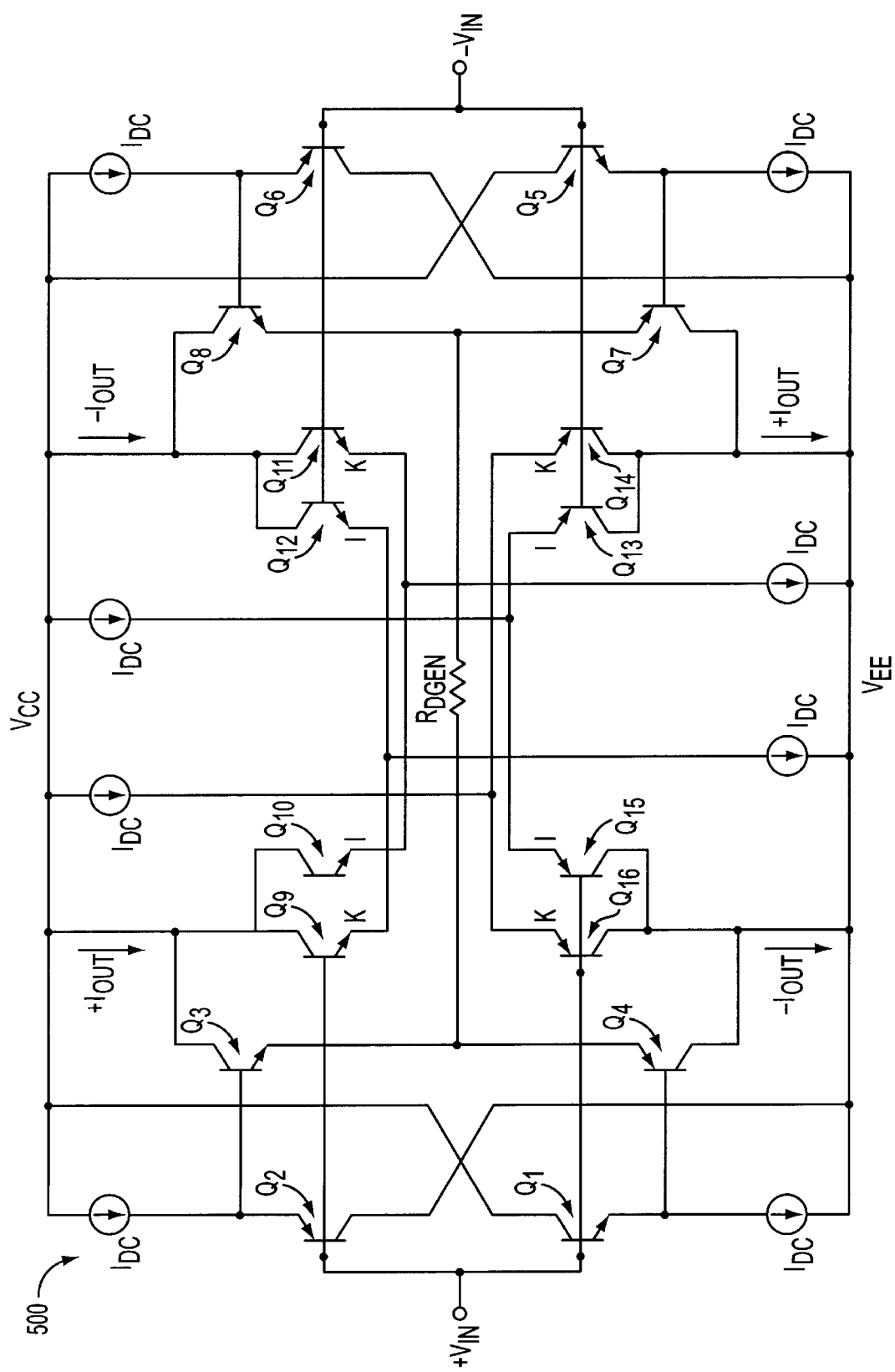
FIG. 12A is a schematic illustrating with particularity one embodiment of the transconductance circuit of FIG. 10.
Figure 12B:
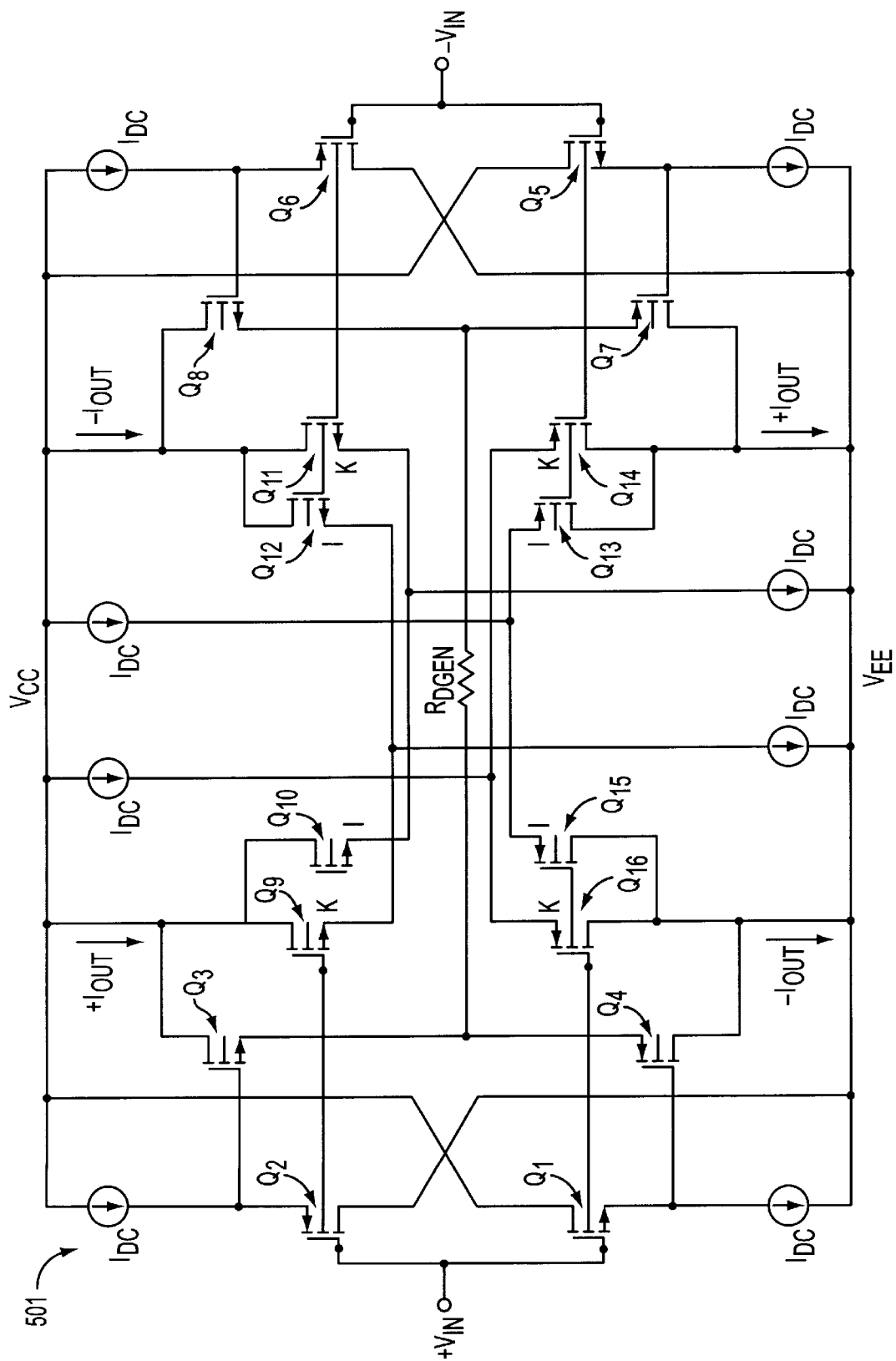
FIG. 12B is a schematic illustrating with particularity another embodiment of the transconductance circuit of FIG. 10.

FIG. 12A illustrates a transconductance circuit 500 in accordance with still another embodiment of the present invention. Like FIG. 10, the transconductance circuit 500 includes a class AB transconductor amplifier and a pair of parallel coupled, voltage offset, concave compensation circuits. Like FIG. 8A, the class AB amplifier of FIG. 12A is formed from a pair of differentially coupled diamond followers whose output emitters may be coupled through a common load resistance $R_{DGEN}$. Alternatively, the common load resistance $R_{DGEN}$ can be left out of the circuit. Each diamond follower includes a pair of bias current sources $I_{DC}$, and four transistors (one follower is made of transistors Q1–Q4, the other follower is made of transistors Q5–Q8). As will be appreciated, the gain of the class AB amplifier of FIG. 12A implemented with bipolar transistors and lacking the common load resistance is ideally a hyperbolic sine (sinh) function.

The convex compensation circuitry of FIG. 12A is formed from two tanh doublets. The first tanh doublet includes two differential pairs Q9–Q12 and Q10–Q11 and two bias current sources $I_{DC}$. The second tanh doublet includes two differential pairs Q16–Q13 and Q15–Q14 and two bias current sources $I_{DC}$. In the embodiment of FIG. 12A, the positive and negative offsets are introduced by forming each differential transistor pair with a size imbalance. Namely, transistors Q10, Q12, Q13, and Q15, all have a relative size of substantially unity while transistors Q9, Q11, Q14, and Q16 all have a relative size of substantially K. Of course, it will be appreciated that offset can be introduced into the tanh doublets through a variety of other mechanisms. For example, the bias current sources $I_{DC}$ can be appropriately imbalanced to create offset in the transconductance gains. Alternatively, the transconductance circuit saturation currents of the transistors can be selected to create the desired offset.

FIGS. 8A, 9A, and 11 illustrated transconductance circuits that utilized one particular type of class AB amplifier. As background, eight different class AB amplifiers (550, 551, 560, 561, 570, 571, 580 and 581, respectively) are illustrated in FIGS. 13A–13H, these being just some of the wide variety of different class AB configurations that are suitable for the present invention.

Figure 13B:
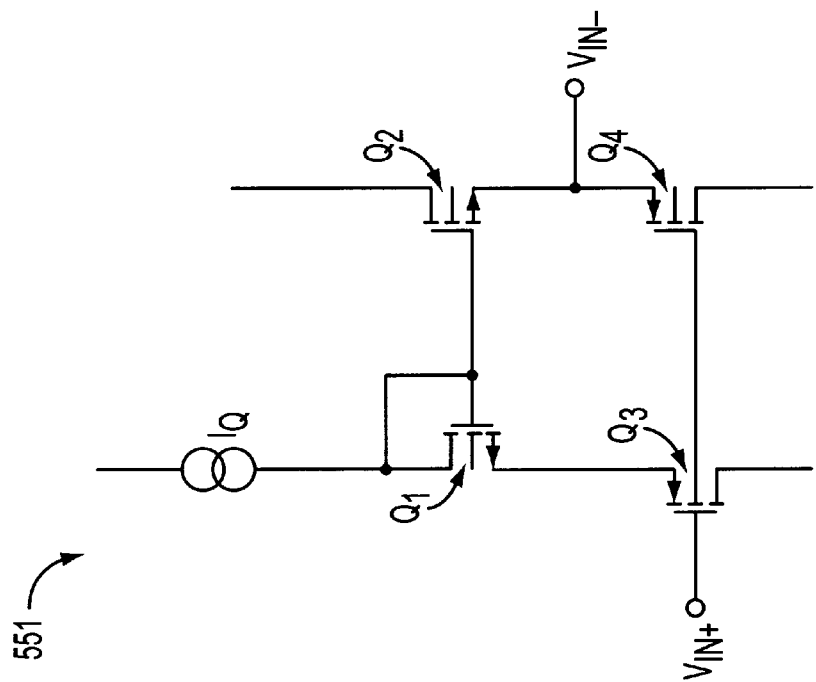
FIGS. 13A, 13B, 13C and 13H provide schematic illustrations of several class AB amplifiers that are suitable for use in the present invention.
Figure 13A:
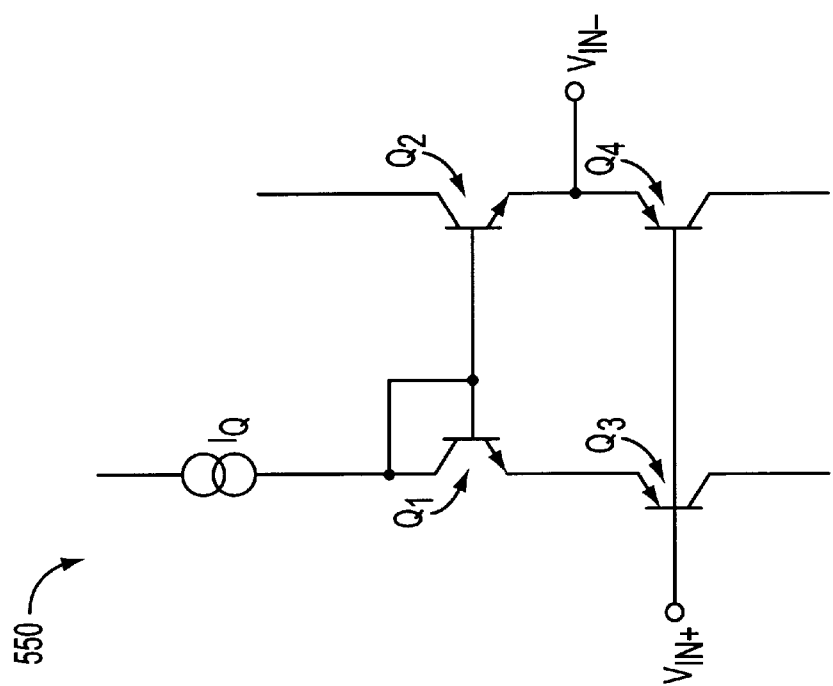
Figure 13D:
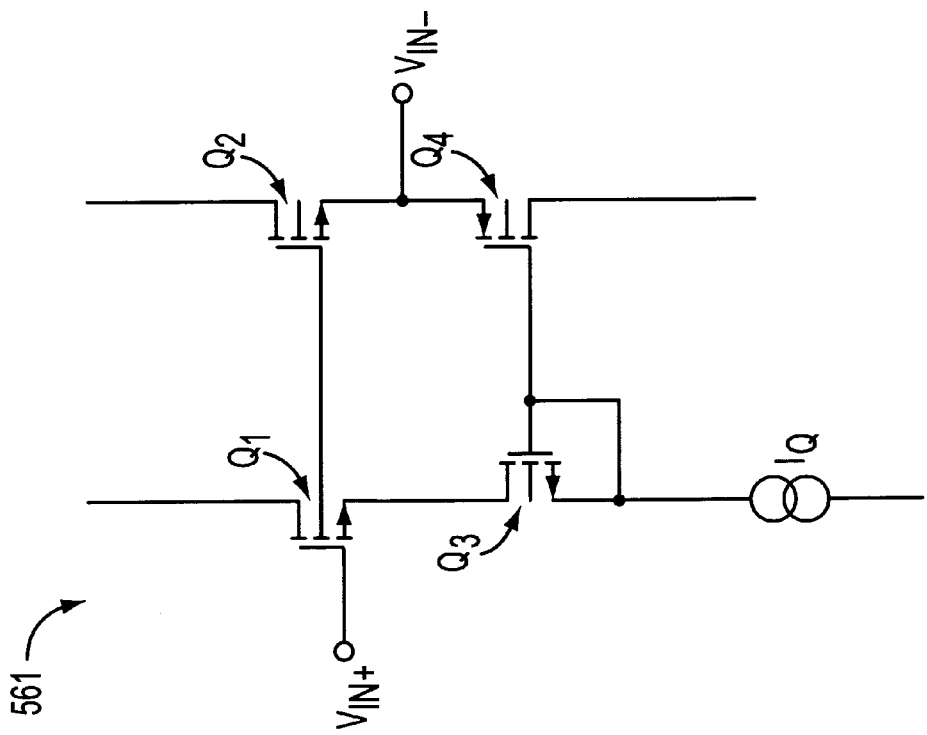
Figure 13C:
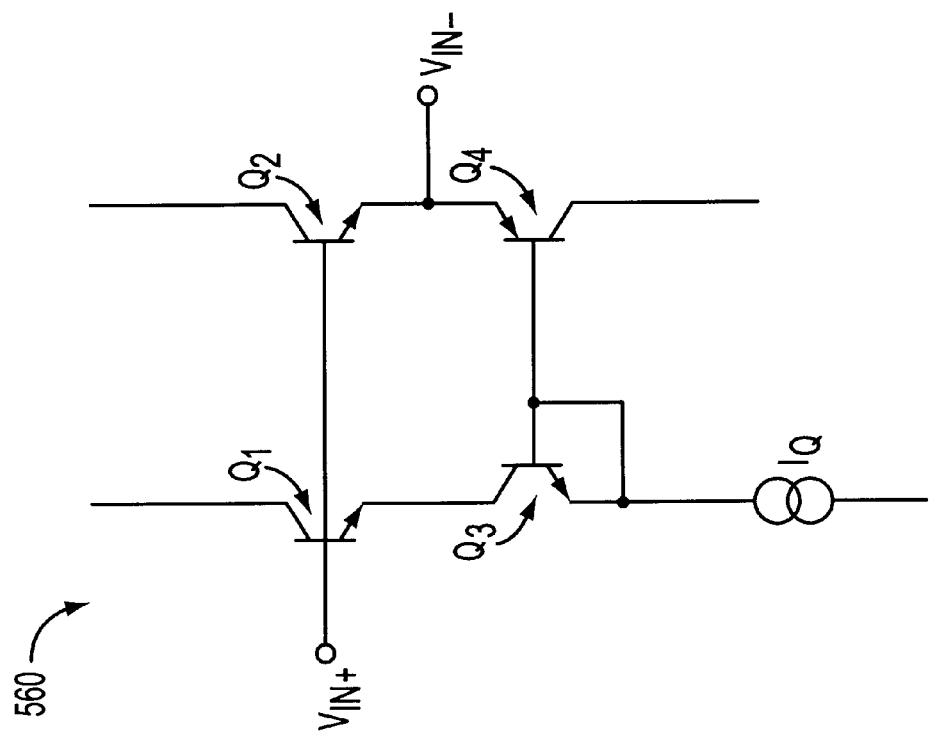
Figure 13F:
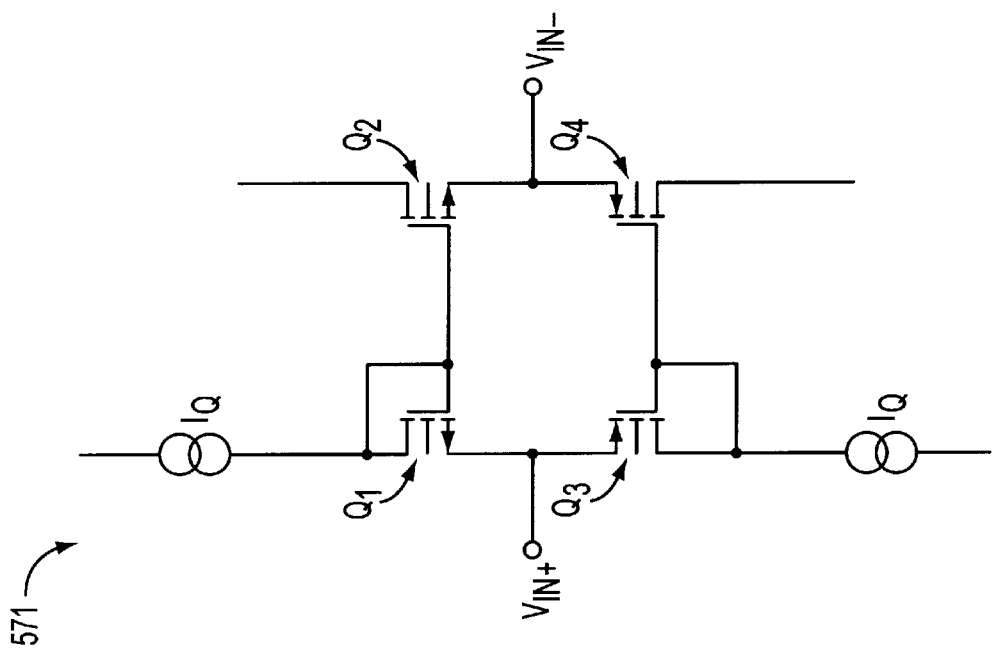

The class AB amplifier 550 of FIG. 13A is formed from a transistor quad (Q1–Q4) and a bias current source Iq. The input voltage $V_{IN+}$ is coupled to the bases of transistors Q3 and Q4. The input voltage $V_{IN-}$ is similarly coupled to the emitters of transistors Q2 and Q4. The emitters of transistors Q1 and Q3 are coupled together. The bias current Iq drives the collector of transistor Q1 and both bases of transistors Q1 and Q2. The class AB amplifier 560 of FIG. 13C is similarly formed from a transistor quad (Q1–Q4) and a bias current source Iq. The input voltage $V_{IN+}$ is coupled to the bases of transistors Q1 and Q2. The input voltage $V_{IN-}$ is similarly coupled to the emitters of transistors Q2 and Q4.

The emitters of transistors Q1 and Q3 are coupled together. The bias current Iq drives the collector of transistor Q3 and both bases of transistors Q3 and Q4.

Figure 13E:
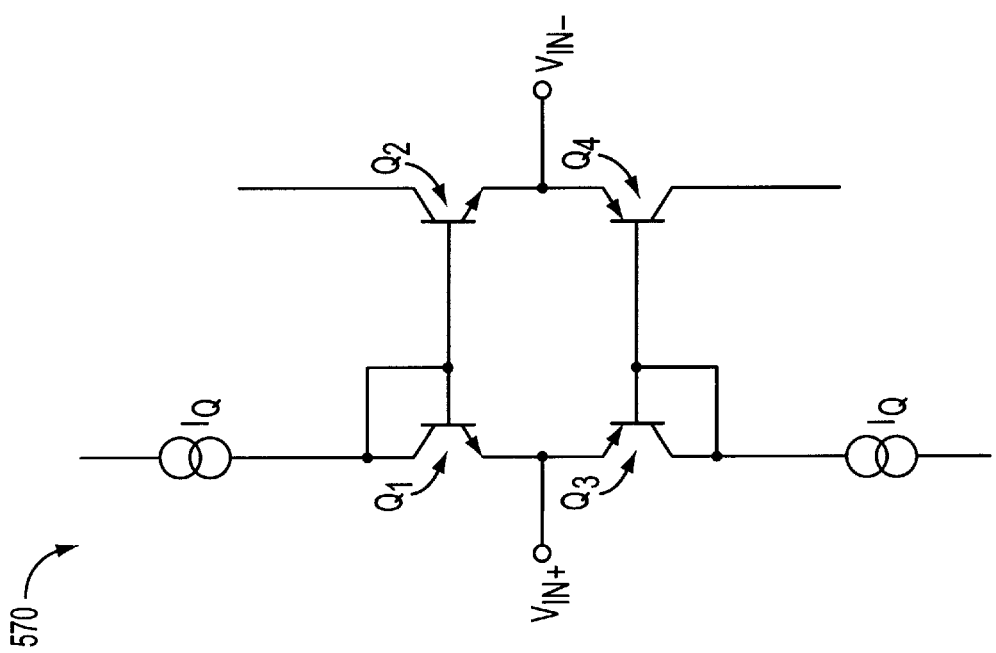

The class AB amplifier 570 of FIG. 13E is formed from a transistor quad (Q1–Q4) coupled with two bias current sources Iq. The input voltage $V_{IN+}$ is coupled to the emitters of transistors Q1 and Q3, while the input voltage $V_{IN-}$ is coupled to the emitters of transistors Q2 and Q4. The first bias current source Iq provides current to the collector of transistor Q1 and the bases of transistors Q2 and Q2. The second bias current source Iq provides current to the collector of transistor Q3 and the bases of transistors Q3 and Q4.

Figure 13G:
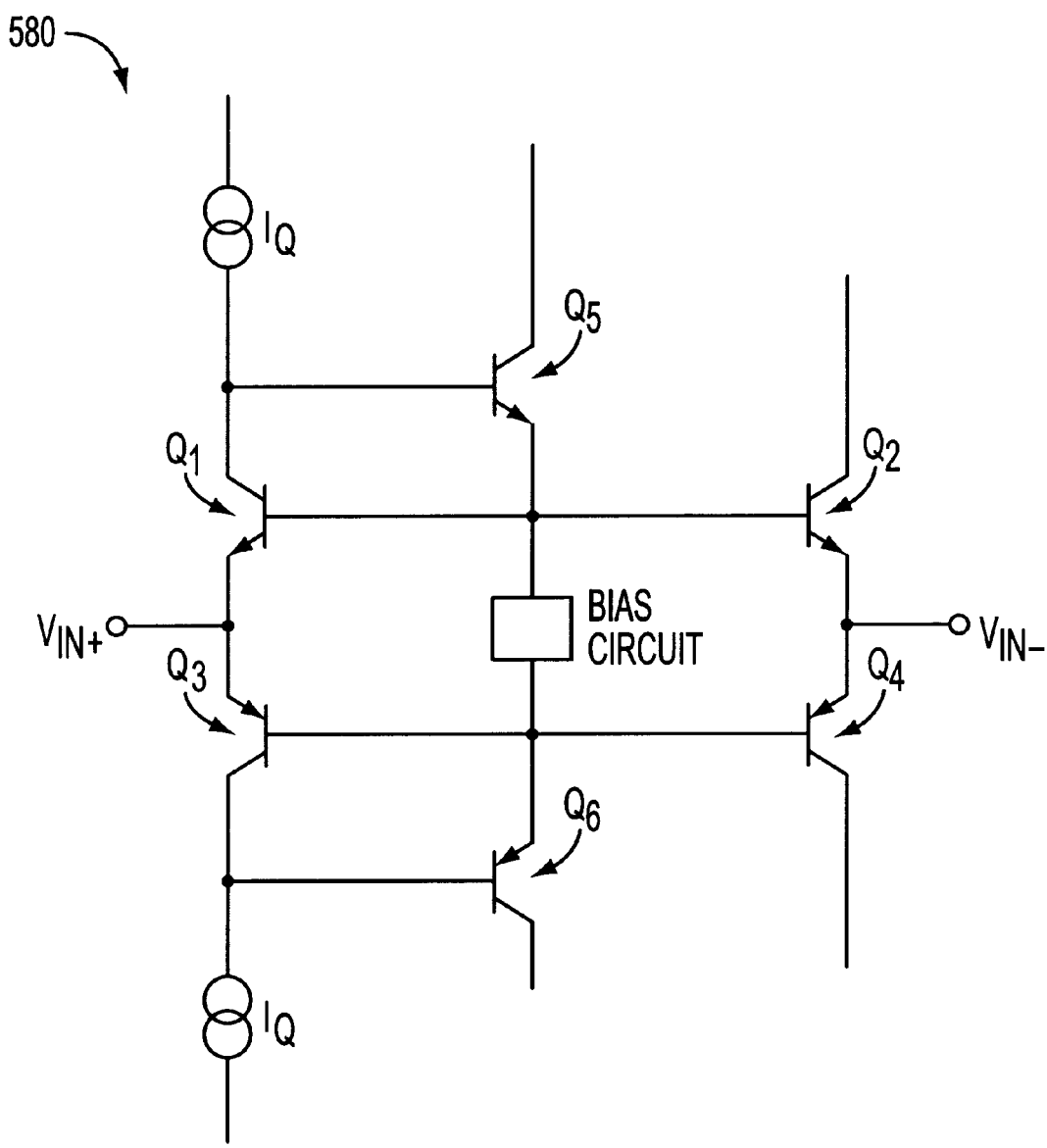
Figure 13H:
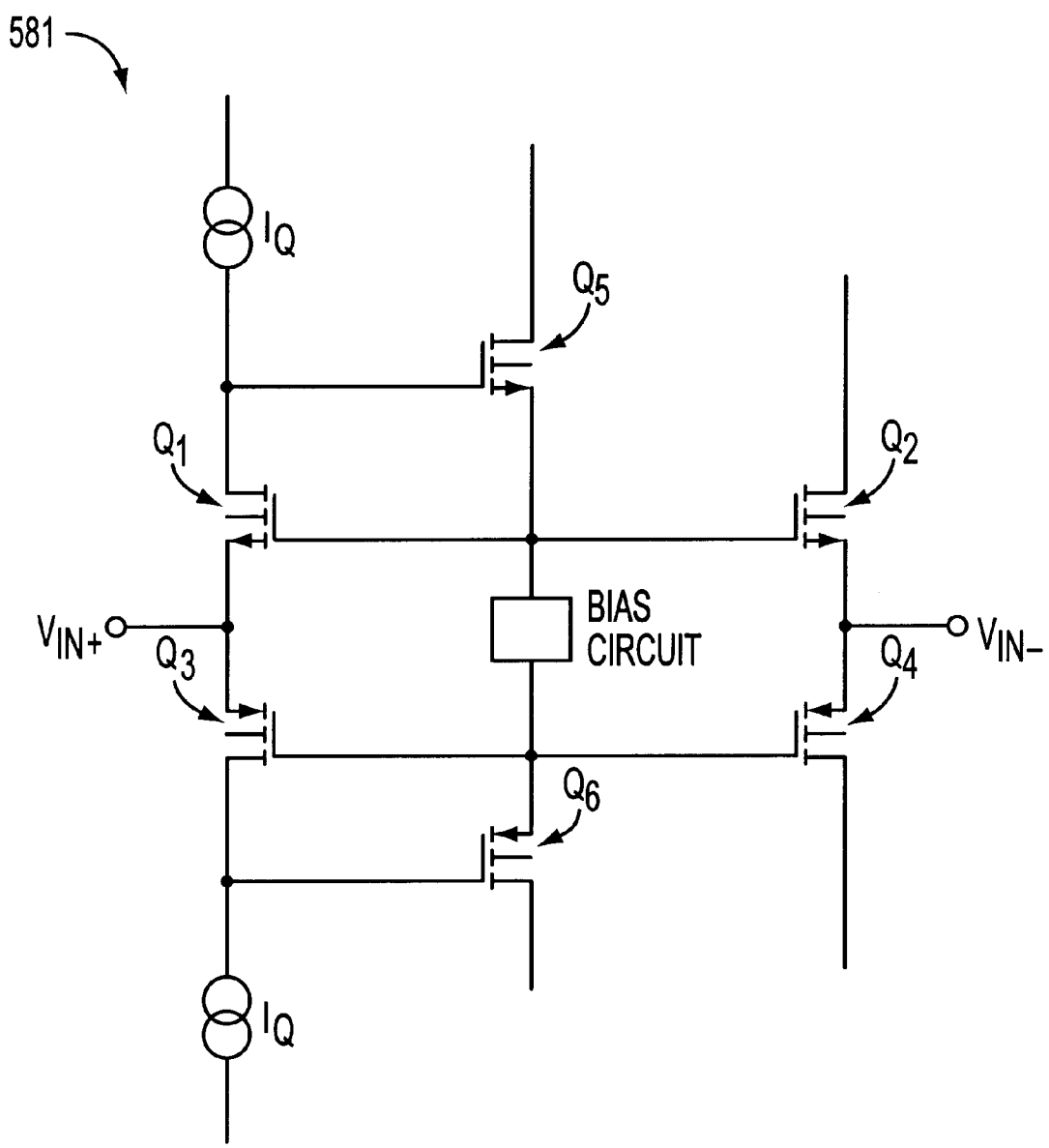

The class AB amplifier 580 of FIG. 13G is formed from six transistors (Q1–Q6), two bias current sources Iq, and a bias circuit. The input voltage $V_{IN+}$ couples to the emitters of transistors Q1 and Q3, while the input voltage $V_{IN-}$ couples to the emitters of transistors Q2 and Q4. The first bias current source Iq provides current to the collector of transistor Q1 and the base of transistors Q5. The second bias current source Iq provides current to the collector of transistor Q3 and the base of transistors Q6. The bias circuit works in conjunction with transistors Q5 and Q6 to provide bias current to the bases of transistors Q1–Q4.

Figure 14:
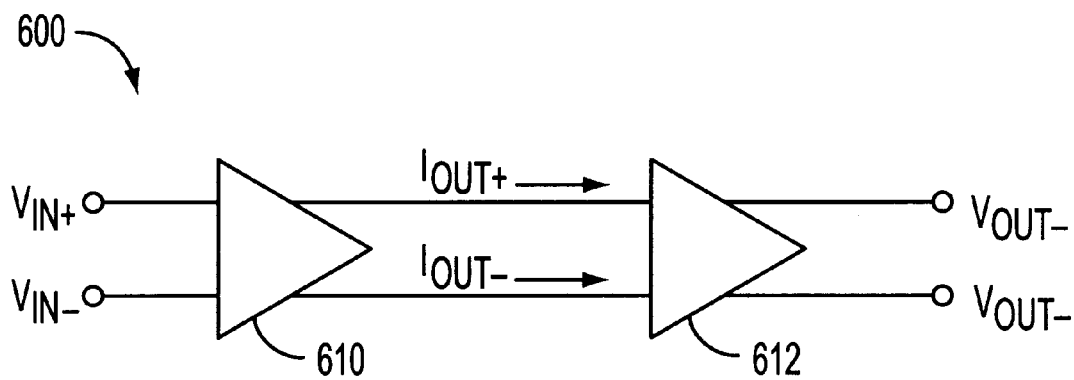
FIG. 14 is a schematic of an operational amplifier in accordance with yet another embodiment of the present invention.

FIG. 14 illustrates an operational amplifier 600 in accordance with still another embodiment of the present invention. FIG. 14 illustrates the operation amplifier 600 including two stages, i.e., input stage 610 and second stage 612. However, as will be appreciated the operational amplifier 600 may well have a plurality of stages coupled according to the specific application. Importantly, however, the input stage 610 includes a linearized transconductor such as the transconductance circuit 300 of FIG. 6 or the transconductance circuit 450 of FIG. 10 and thus exhibits the improved linearity described above. The second stage 612 may be a gain stage or output stage operable to amplify the output current provided by the input stage 610, generating output voltage that is an amplified version of the input voltage provided at the input stage 612.

Figure 15:
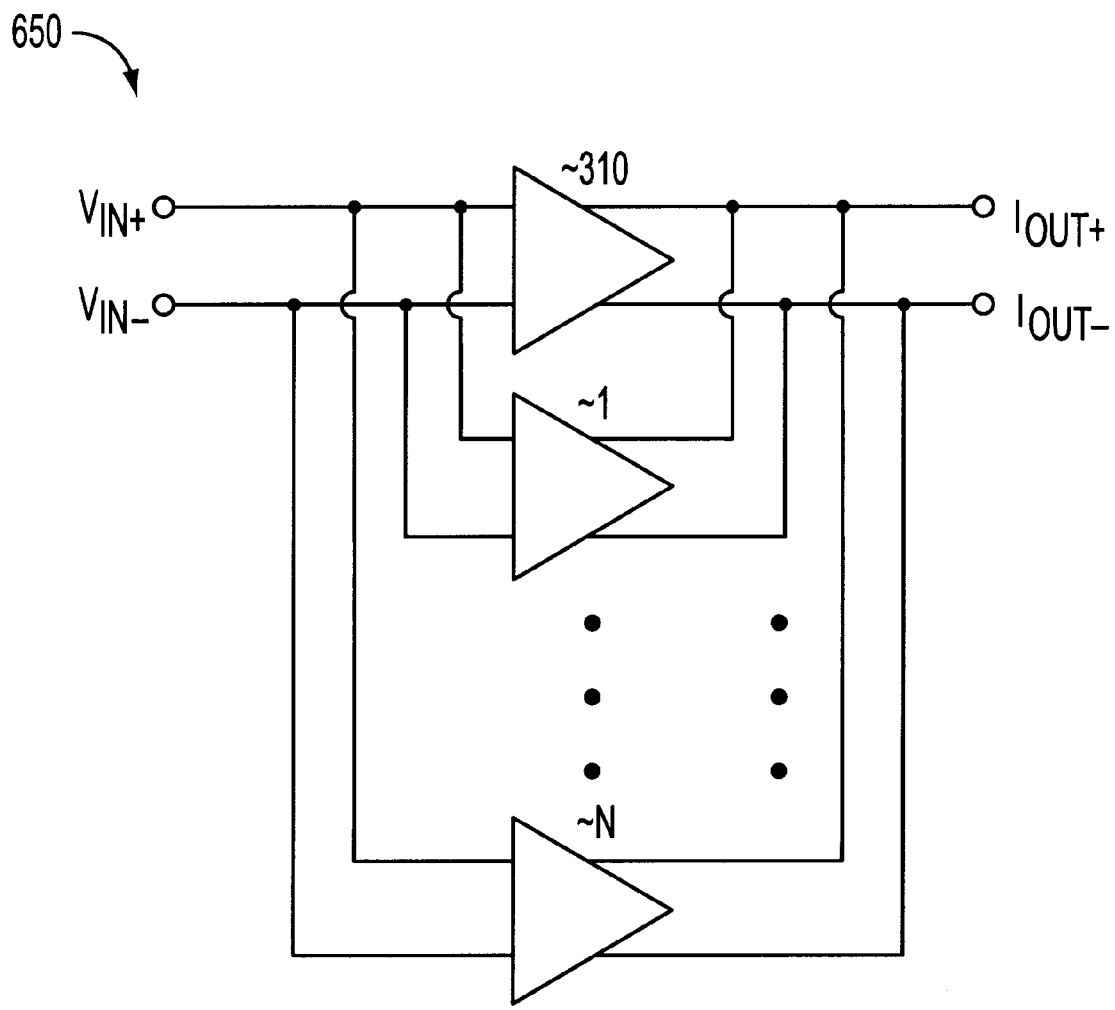
FIG. 15 is a schematic of a transconductance circuit having a plurality of concave compensation stages in accordance with still another embodiment of the present invention.

FIG. 15 illustrates a transconductance circuit 650 having a class AB amplifier 310 and a plurality N of concave compensation circuits coupled in parallel across input and output terminals. Each concave compensation circuit 1 through N is designed with an offset chosen such that the individual nonlinear transfer functions are arranged along the input voltage axis to achieve a more linear transfer function of the combined transconductance circuit. These compensation circuits may have identical transfer functions (except for the offset), or may be selected according to the desired result.

The embodiments described in the preceding paragraphs directly connected the outputs of class AB amplifier with the parallel concave compensation circuits. This essentially resulted in directly summing their outputs thereby improving linearity at the output of the transconductor stage. However, it is contemplated that the outputs of the circuitry of the transconductor stage may be coupled to separate stages. By driving individual stages that are later combined to provide the final output of the total circuit, the linearity of the total circuit is improved—even though linearity of the transconductance stage may not directly appear more linear.

Figure 16:
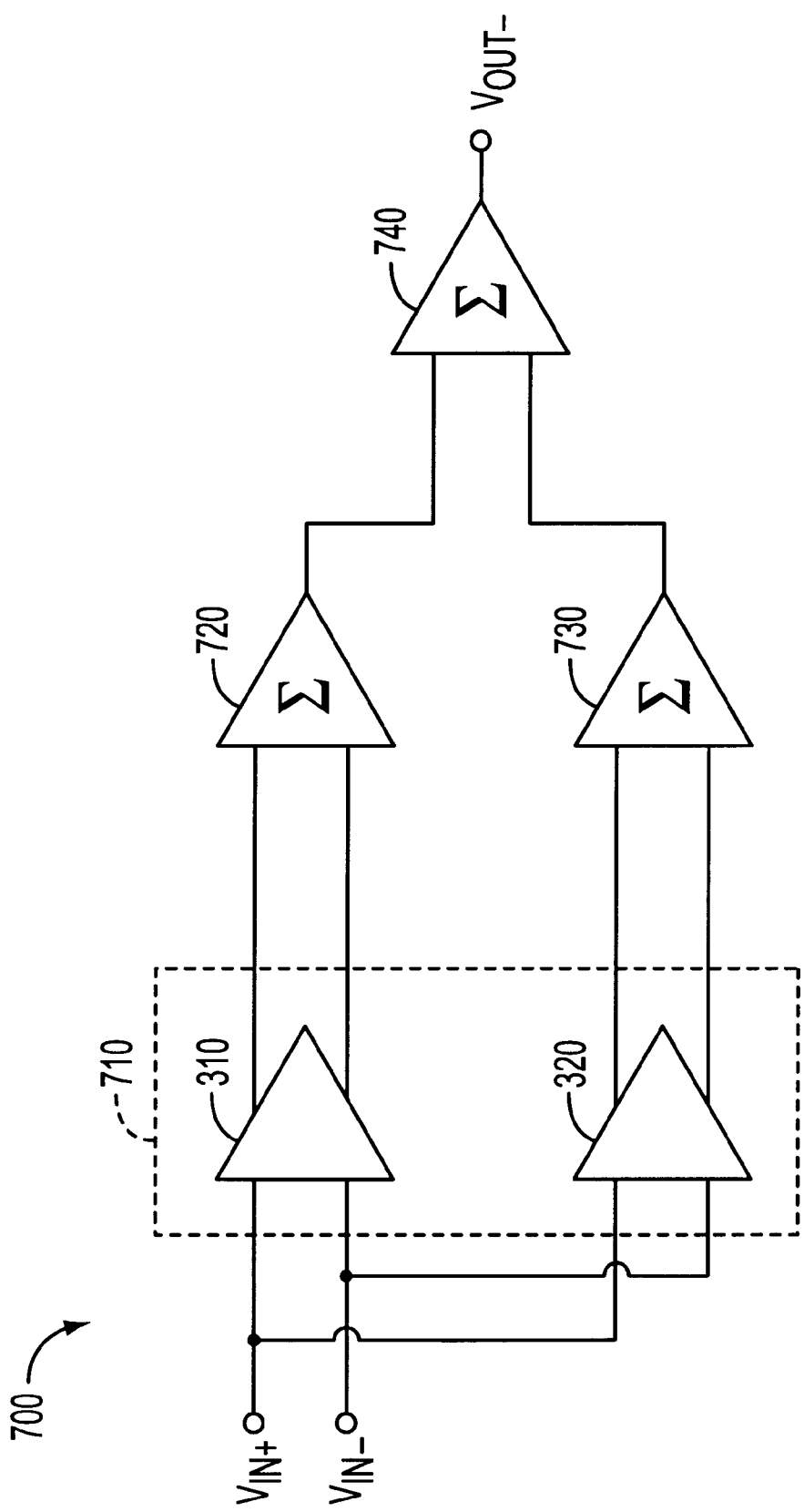
FIG. 16 is a schematic of a multiple stage circuit in accordance with a separate embodiment of the present invention.

Turning to FIG. 16, a summing circuit 700 provides one example of such a multiple stage circuit. In FIG. 16, the summing circuit 700 includes a transconductance circuit 710 having a class AB transconductance amplifier 310 parallel coupled with a concave compensation circuit 320 and driving separate subsequent stages of the summing circuit. In this instance, the transconductance circuit 710 drives a pair of arithmetic circuits 720 and 730, that in turn drive a final summer circuit 740. Of course, the summing circuit 700 of FIG. 13 is simply one example illustrating the decoupling of the outputs of the class AB transconductance amplifiers. Further, it will be appreciated that the transconductance circuit 710 could include a plurality of concave compensation circuits each having a properly selected offset.

According to another aspect of the present invention, the transconductance circuitry may include devices other than a single class AB amplifier and concave compensation circuitry. Other circuitry may be coupled in parallel and/or in series in order to achieve desired electrical characteristics of the transconductance circuitry.

Although only a few embodiments of the present invention have been described in detail herein, it should be understood that the present invention may be embodied in many other specific forms without departing from the spirit or scope of the invention.

For example, in the FIGS. 8A, 9A, 12A, 13A, 13C, 13E, and 13G, bipolar type transistor technology is used. However, it will be appreciated that field-effect transistors (FETs) such as MOSFETs would work well for the present invention, as shown in FIGS. 8B, 9B, 12B, 13B, 13D, 13F and 13H.

The present invention, is in no way limited to the particular class AB amplifiers described herein. Instead, as earlier mentioned, it is contemplated that any combination of any type of class AB amplifiers would be suitable. Similarly, the concave compensation circuitry can be implemented through any of a variety of well-known circuitry that exhibits the desired concave transconductance gain suitable to compensate for the convex nature of the class AB amplifier.

Therefore, the present examples and embodiments are to be considered as illustrative and not restrictive, and the invention is not to be limited to the details given herein, but may be modified within the scope of the appended claims.

What is claimed is:

1. A transconductance circuit characterized by a voltage to current transfer function, the transconductance circuit comprising:

a class AB transconductance amplifier and a concave compensation circuit coupled in parallel across differential input and output terminal pairs, wherein the concave transconductance gain of the compensation circuit improves linearity of the voltage to current transfer function of the transconductance circuit by compensating for the convex transconductance gain of the class AB amplifier; and wherein said compensation circuit includes first and second parts, said first part having a positive offset and said second part having a negative offset.

2. A transconductance circuit as recited in claim 1, wherein each of the first and second parts of the concave compensation circuit is a differential transistor pair.

3. A transconductance circuit characterized by a voltage to current transfer function, the transconductance circuit comprising:

a class AB transconductance amplifier, wherein the class AB amplifier includes a pair of differentially coupled diamond followers, each diamond follower having four transistors and two bias current sources, the transconductance of the first class AB amplifier being a function of transistor gain and the available bias current; and a concave compensation circuit wherein the concave compensation circuit includes two differential transistor pairs, the concave compensation circuit and the class AB transconductance amplifier coupled in parallel across differential input and output terminals, wherein the concave transconductance gain of the concave compensation circuit improves linearity of the voltage to current transfer function of the transconductance circuit by compensating for the convex transconductance gain of the class AB amplifier.

4. A transconductance circuit as recited in claim 3 wherein the class AB amplifier further includes a common load resistance $R_{DGEN}$ coupling the outputs of the differentially coupled diamond followers.

5. A transconductance circuit as recited in claim 3 wherein the transistors are bipolar transistors.

6. A transconductance circuit as recited in claim 3 wherein the transistors are field-effect transistors.

7. A transconductance circuit as recited in claim 3 wherein the class AB amplifier includes four transistors Q1–Q4 and a current source Iq, the current source Iq providing bias current to the collector of transistor Q1 and the bases of transistors Q1 and Q2, the emitters of transistors Q1 and Q3 are coupled, the emitters of transistors Q2 and Q4 are coupled, and the bases of Q3 and Q4 are coupled.

8. A transconductance circuit as recited in claim 3 wherein the class AB amplifier includes four transistors Q1–Q4 and a current source Iq, the current source Iq provides bias current to the collector of transistor Q3 and the bases of transistors Q3 and Q4, the emitters of transistors Q1 and Q3 are coupled, the emitters of Q2 and Q4 are coupled, and the bases of Q1 and Q2 are coupled.

9. A transconductance circuit as recited in claim 3 wherein the class AB amplifier includes four transistors Q1–Q4 and first and second current sources Iq, the first current source provides bias current to the collector of transistor Q1 and the bases of transistors Q1 and Q2, the second current source Iq provides bias current to the collector of transistor Q3 and the bases of transistors Q3 and Q4, the emitters of transistors Q1 and Q3 are coupled, and the emitters of Q2 and Q4 are coupled.

10. A transconductance circuit as recited in claim 3 wherein the class AB amplifier includes six transistors Q1–Q6, first and second current sources, and a bias circuit, wherein the first current source provides bias current to the base of transistor Q5 and the collector of transistor Q1, the second current source provides bias current to the base of transistor Q6 and the collector of transistor Q3, bias current is provided to the bases of transistors Q1–Q4 via transistors Q5 and Q6 and the bias circuit, the emitters of Q1 and Q3 are coupled, and the emitters of Q2 and Q4 are coupled.

11. A transconductance circuit as recited in claim 3 wherein the concave compensation circuit is a first concave compensation circuit, the transconductance circuit further comprising a second concave compensation circuit parallel coupled with the class AB amplifier and the first concave compensation circuit, the first and second concave compensation circuits each having an offset selected to improve the linearity of the voltage to current transfer function of the transconductance circuit.

12. A transconductance circuit as recited in claim 11 wherein the offset of the first concave compensation circuit is a positive offset and the offset of the second concave compensation circuit is a negative offset.

13. A transconductance circuit as recited in claim 12 wherein the magnitudes of the offsets are substantially equivalent.

14. A transconductance circuit as recited in claim 11 wherein the first concave compensation circuit is a tanh doublet formed including four transistors.

15. A transconductance circuit as recited in claim 14 wherein the offset of the first concave compensation circuit is due to an imbalance between the sizes of the transistors of the tanh doublet.

16. A transconductance circuit as recited in claim 14 wherein the offset is due to an imbalance between the bias current sources of the tanh doublet.

17. A transconductance circuit as recited in claim 14 wherein the offset is due both in part to an imbalance between the sizes of the transistors of the tanh doublet and in part to an imbalance between the bias current sources of the tanh doublet.

18. A transconductance circuit as recited in claim 14 wherein the two concave compensation circuits are of identical type.

19. A transconductance circuit as recited in claim 11 further including a third parallel coupled concave compensation circuit, the third concave compensation circuit having a zero offset.

20. A transconductance circuit characterized by a voltage to current transfer function, the transconductance circuit comprising:
an input terminal;
an output terminal;
a class AB transconductance amplifier coupled across the input and output terminal;
a first concave compensation circuit parallel coupled with the class AB transconductance amplifier, the first concave compensation circuit having a positive offset; and
a second concave compensation circuit parallel coupled with the class AB transconductance amplifier, the second concave compensation circuit having a negative offset.

21. A transconductance circuit as recited in claim 20 wherein the magnitudes of the offsets are substantially equivalent.

22. A transconductance circuit as recited in claim 20 wherein the first concave compensation circuit is a tanh doublet formed including four transistors and a pair of bias current sources.

23. A transconductance circuit as recited in claim 22 wherein the offset of the first concave compensation circuit is due to an imbalance between the sizes of the transistors of the tanh doublet.

24. A transconductance circuit as recited in claim 22 wherein the offset is due to an imbalance between the bias current sources of the tanh doublet.

25. A transconductance circuit as recited in claim 22 wherein the offset is due both in part to an imbalance between the sizes of the transistors of the tanh doublet and in part to an imbalance between the bias current sources of the tanh doublet.

26. A transconductance circuit as recited in claim 20 wherein the two concave compensation circuits are of identical type.

27. A transconductance circuit as recited in claim 20 further including a third parallel coupled concave compensation circuit, the third concave compensation circuit having a zero offset.

28. A transconductance circuit as recited in claim 20 wherein the class AB amplifier includes a pair of differentially coupled diamond followers, each diamond follower having four transistors and two bias current sources.

29. A transconductance circuit as recited in claim 28 wherein the class AB amplifier further includes a common load resistance $R_{DGEN}$ coupling the outputs of the differentially coupled diamond followers.

30. A transconductance circuit as recited in claim 20 wherein the class AB amplifier includes four transistors Q1–Q4 and a current source Iq, the current source Iq providing bias current to the collector of transistor Q1 and the bases of transistors Q1 and Q2, the emitters of transistors Q1 and Q3 are coupled, the emitters of transistors Q2 and Q4 are coupled, and the bases of Q3 and Q4 are coupled.

31. A transconductance circuit as recited in claim 20 wherein the class AB amplifier includes four transistors Q1–Q4 and a current source Iq, the current source Iq provides bias current to the collector of transistor Q3 and the bases of transistors Q3 and Q4, the emitters of transistors Q1 and Q3 are coupled, the emitters of Q2 and Q4 are coupled, and the bases of Q1 and Q2 are coupled.

32. A transconductance circuit as recited in claim 20 wherein the class AB amplifier includes four transistors Q1–Q4 and first and second current sources Iq, the first current source provides bias current to the collector of transistor Q1 and the bases of transistors Q1 and Q2, the second current source Iq provides bias current to the collector of transistor Q3 and the bases of transistors Q3 and Q4, the emitters of transistors Q1 and Q3 are coupled, and the emitters of Q2 and Q4 are coupled.

33. A transconductance circuit as recited in claim 20 wherein the class AB amplifier includes six transistors Q1–Q6, first and second current sources, and a bias circuit, wherein the first current source provides bias current to the base of transistor Q5 and the collector of transistor Q1, the second current source provides bias current to the base of transistor Q6 and the collector of transistor Q3, bias current is provided to the bases of transistors Q1–Q4 via transistors Q5 and Q6 and the bias circuit, the emitters of Q1 and Q3 are coupled, and the emitters of Q2 and Q4 are coupled.

34. An operational amplifier comprising:
    an input stage characterized by a voltage to current transfer function, the input stage comprising:
        a class AB transconductance amplifier, wherein the class AB amplifier includes a pair of differentially coupled diamond followers, each diamond follower having four transistors and two bias current sources, the transconductance of the first class AB amplifier being a function of transistor gain and the available bias current; and
        a concave compensation circuit including two differential transistor pairs, the class AB amplifier and concave compensation circuit coupled in parallel across differential input and output pairs, wherein the concave transconductance gain of the concave compensation circuit improves linearity of the voltage to current transfer function of the input stage by compensating for the convex transconductance gain of the class AB amplifier; and a second stage coupled in series with the input stage.

35. An operational amplifier as recited in claim 34 wherein the class AB amplifier further includes a common load resistance $R_{DGEN}$ coupling the outputs of the differentially coupled diamond followers.

36. An operational amplifier as recited in claim 34 wherein the transistors are bipolar transistors.

37. An operational amplifier as recited in claim 34 wherein the transistors are field-effect transistors.

38. An operational amplifier as recited in claim 34 wherein the class AB amplifier includes four transistors QB1–QB4 and a current source Iq, the current source Iq providing bias current to the collector of transistor QB1 and the bases of transistors QB1 and QB2, the emitters of transistors QB1 and QB3 are coupled, the emitters of transistors QB2 and QB4 are coupled, and the bases of QB3 and QB4 are coupled.

39. An operational amplifier as recited in claim 34 wherein the class AB amplifier includes four transistors QB1–QB4 and a current source Iq, the current source Iq provides bias current to the collector of transistor QB3 and the bases of transistors QB3 and QB4, the emitters of transistors QB1 and QB3 are coupled, the emitters of QB2 and QB4 are coupled, and the bases of QB1 and QB2 are coupled.

40. An operational amplifier as recited in claim 34 wherein the class AB amplifier includes four transistors QB1–QB4 and first and second current sources Iq, the first current source provides bias current to the collector of transistor QB1 and the bases of transistors QB1 and QB2, the second current source Iq provides bias current to the collector of transistor QB3 and the bases of transistors QB3 and QB4, the emitters of QB1 and QB3 are coupled, and the emitters of QB2 and QB4 are coupled.

41. An operational amplifier as recited in claim 3 wherein the class AB amplifier includes six transistors Q1–Q6, first and second current sources, and a bias circuit, wherein the first current source provides bias current to the base of transistor Q5 and the collector of transistor Q1, the second current source provides bias current to the base of transistor Q6 and the collector of transistor Q3, bias current is provided to the bases of transistors Q1–Q4 via transistors Q5 and Q6 and the bias circuit, the emitters of Q1 and Q3 are coupled, and the emitters of Q2 and Q4 are coupled.

42. An operational amplifier as recited in claim 3 wherein the concave compensation circuit is a first concave compensation circuit, the transconductance circuit further comprising a second concave compensation circuit parallel coupled with the class AB amplifier and the first concave compensation circuit, the first and second concave compensation circuits each having an offset selected to improve the linearity of the voltage to current transfer function of the transconductance circuit.

43. An operational amplifier as recited in claim 42 wherein the offset of the first concave compensation circuit is a positive offset and the offset of the second concave compensation circuit is a negative offset.

44. An operational amplifier as recited in claim 43 wherein the magnitudes of the offsets are substantially equivalent.

45. An operational amplifier as recited in claim 42 wherein the first concave compensation circuit is a tanh doublet formed including four transistors.

46. An operational amplifier as recited in claim 45 wherein the offset of the first concave compensation circuit is due to an imbalance between the sizes of the transistors of the tanh doublet.

47. An operational amplifier as recited in claim 45 wherein the offset of the first concave compensation circuit is due to an imbalance between the bias current sources of the tanh doublet.

48. An operational amplifier as recited in claim 45 wherein the offset of the first concave compensation circuit is due both in part to an imbalance between the sizes of the transistors of the tanh doublet and in part to an imbalance between the bias current sources of the tanh doublet.

49. An operational amplifier as recited in claim 45 wherein the two concave compensation circuits are of identical type.

50. An operational amplifier as recited in claim 42 further including a third parallel coupled concave compensation circuit, the third concave compensation circuit having a zero offset.

51. An operational amplifier as recited in claim 34 wherein the second stage is an output stage.

52. An operational amplifier as recited in claim 34 wherein the second stage is a gain stage.

53. An operational amplifier as recited in claim 34 wherein the second stage is one of a plurality of stages subsequent to the input stage.

54. A multiple stage circuit comprising:
- a transconductance stage suitable for converting a voltage signal into a current signal, the transconductance stage having a convex transconductance amplifier, a first concave transconductance amplifier having a positive offset, the convex amplifier and first concave amplifier coupled in parallel, inputs of the two parallel coupled transconductance amplifiers being directly coupled while the outputs of the two parallel coupled transconductance amplifiers are not directly coupled, and a second concave transconductance amplifier having a negative offset, the negative and positive offsets being selected to improve linearity of the multiple stage circuit; and
- a plurality of stages subsequent to the transconductance stage, the plurality of stages subsequent to the transconductance stage including:
  - a second stage responsive to a current signal, wherein an input of the second stage is coupled to an output of the convex transconductance amplifiers; and
  - a third stage responsive to a current signal, wherein an input of the third stage is coupled to an output of the concave transconductance amplifiers.

55. A multiple stage circuit as recited in claim 56 wherein the convex transconductance amplifier is a first class AB amplifier.

56. A multiple stage circuit comprising:
- a transconductance stage suitable for converting a voltage signal into a current signal, the transconductance stage having a convex transconductance amplifier and a concave transconductance amplifier coupled in parallel, inputs of the two parallel coupled transconductance amplifiers being directly coupled while the outputs of the two parallel coupled transconductance amplifiers are not directly coupled, wherein the concave transconductance amplifier is a tanh doublet; and
- a plurality of stages subsequent to the transconductance stage, the plurality of stages subsequent to the transconductance stage including:
  - a second stage responsive to a current signal, wherein an input of the second stage is coupled to an output of the convex transconductance amplifiers; and
  - a third stage responsive to a current signal, wherein an input of the third stage is coupled to an output of the concave transconductance amplifiers.

57. A transconductance circuit characterized by a voltage to current transfer function, the transconductance circuit comprising a class AB transconductance amplifier and a concave compensation circuit, pairs coupled in parallel across differential input and output terminal, the concave compensation circuit including two differential transistor pairs, each differential pair of the concave compensation circuit having their emitters coupled by a pair of series resistors and a bias current source driving the resistors, wherein the concave transconductance gain of the concave compensation circuit improves linearity of the voltage to current transfer function of the transconductance circuit by compensating for the convex transconductance gain of the class AB amplifier.

58. A transconductance circuit as recited in claim 57 wherein the class AB amplifier includes a pair of differentially coupled diamond followers, each diamond follower having four transistors and two bias current sources, the transconductance of the first class AB amplifier being a function of transistor gain and the available bias current.

59. A transconductance circuit as recited in claim 58 wherein the class AB amplifier further includes a common load resistance $R_{DGEN}$ coupling the outputs of the differentially coupled diamond followers.

60. A transconductance circuit as recited in claim 58 wherein the transistors are bipolar transistors.

61. A transconductance circuit as recited in claim 58 wherein the transistors are field-effect transistors.

* * * * *

UNITED STATES PATENT AND TRADEMARK OFFICE
CERTIFICATE OF CORRECTION

PATENT NO.     : 6,188,281 B1
DATED          : February 13, 2001
INVENTOR(S)    : Douglas L. Smith et al.

It is certified that error appears in the above-identified patent and that said Letters Patent is hereby corrected as shown below:

Column 4,
Line 21, reads "FIGS. 13A, 13B, 13C and 13H provide schematic illus-";
It should read -- Figs. 13A-13H provide schematic illus- --;
Lines 57-58, read "parallel across differential input differentials 330 and differential output differentials 340. The range of suitable concave";
They should read -- parallel across differential input terminals 330 and differential output terminals 340. The range of suitable concave --;

Column 6,
Lines 46-48, read "Alternatively, the transconductance circuit saturation currents of the transistors can be selected to create the desired offset";
They should read -- Alternatively, the saturation currents of the transistors can be selected to create the desired offset --;

Column 12,
Line 21, reads "and QB4, the emitters of QB1 and QB3 are coupled, and the";
It should read -- and QB4, the emitters of transistors QB1 and QB3 are coupled, and the --

Column 14,
Line 19, reads "across differential input and output terminals, the concave";
It should read -- across differential input and output terminals, the concave --

Signed and Sealed this

Twentieth Day of August, 2002

Attest:

Attesting Officer

JAMES E. ROGAN
*Director of the United States Patent and Trademark Office*